(12) United States Patent
Liao et al.

(10) Patent No.: US 7,989,243 B2
(45) Date of Patent: Aug. 2, 2011

(54) METHOD FOR FABRICATING PIXEL STRUCTURE

(75) Inventors: Ta-Wen Liao, Hsinchu County (TW);
Chen-Pang Tung, Taipei (TW);
Chia-Ming Chang, Taipei County (TW);
Zong-Long Jhang, Taichung (TW);
Che-Yung Lai, Taichung County (TW);
Chun-Yi Chiang, Taichung (TW);
Chou-Huan Yu, Taichung County (TW);
Hsiang-Chih Hsiao, Keelung (TW);
Han-Tang Chou, Taoyuan County (TW); Jun-Kai Chang, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 12/398,987

(22) Filed: Mar. 5, 2009

(65) Prior Publication Data
US 2010/0003774 A1 Jan. 7, 2010

(30) Foreign Application Priority Data
Jul. 7, 2008 (TW) ................................ 97125586 A

(51) Int. Cl.
*H01L 21/00* (2006.01)
(52) U.S. Cl. ............... 438/30; 438/29; 438/34; 438/38; 438/42; 438/43; 438/149; 438/151; 438/158; 438/164
(58) Field of Classification Search .................. 438/29, 438/30, 34, 38, 42, 43, 149, 151, 158, 164
See application file for complete search history.

(56) References Cited

U.S. PATENT DOCUMENTS

| | | | |
|---|---|---|---|
| 5,919,532 A | 7/1999 | Sato et al. | |
| 7,041,522 B2 | 5/2006 | Tanaka et al. | |
| 7,180,559 B2 * | 2/2007 | Chang et al. | 349/106 |
| 7,439,089 B2 * | 10/2008 | Kim | 438/30 |
| 7,525,624 B2 * | 4/2009 | Kim | 349/139 |
| 7,645,649 B1 * | 1/2010 | Lai et al. | 438/151 |
| 2002/0089615 A1 | 7/2002 | Sakamoto et al. | |

(Continued)

FOREIGN PATENT DOCUMENTS

| | | |
|---|---|---|
| CN | 1716062 | 1/2006 |
| CN | 101149541 | 3/2008 |
| CN | 101197332 | 6/2008 |

OTHER PUBLICATIONS

"1st Office Action of China counterpart application", issued on Jul. 24, 2009, p. 1-p. 7.

(Continued)

*Primary Examiner* — Kevin M Picardat
*Assistant Examiner* — Bac H Au
(74) *Attorney, Agent, or Firm* — Jianq Chyun IP Office

(57) ABSTRACT

A pixel structure fabricating method is provided. A gate is formed on a substrate. A gate insulation layer covering the gate is formed on the substrate. A channel layer, a source, and a drain are simultaneously formed on the gate insulation layer above the gate. The gate, channel layer, source, and drain form a thin film transistor (TFT). A passivation layer is formed on the TFT and the gate insulation layer. A black matrix is formed on the passivation layer. The black matrix has a contact opening above the drain and a color filter containing opening. A color filer layer is formed within the color filter containing opening through inkjet printing. A dielectric layer is formed on the black matrix and the color filter layer. The dielectric layer and the passivation layer are patterned to expose the drain. A pixel electrode electrically connected to the drain is formed.

18 Claims, 22 Drawing Sheets

U.S. PATENT DOCUMENTS

2004/0266041 A1    12/2004  Kim
2006/0006385 A1*    1/2006  Park .................................. 257/59
2006/0186411 A1     8/2006  Kim et al.
2007/0109467 A1     5/2007  Chang et al.

OTHER PUBLICATIONS

"3rd Office Action of China Counterpart Application", issued on Jun. 28, 2010, p. 1-p. 7, in which the listed reference was cited.

* cited by examiner

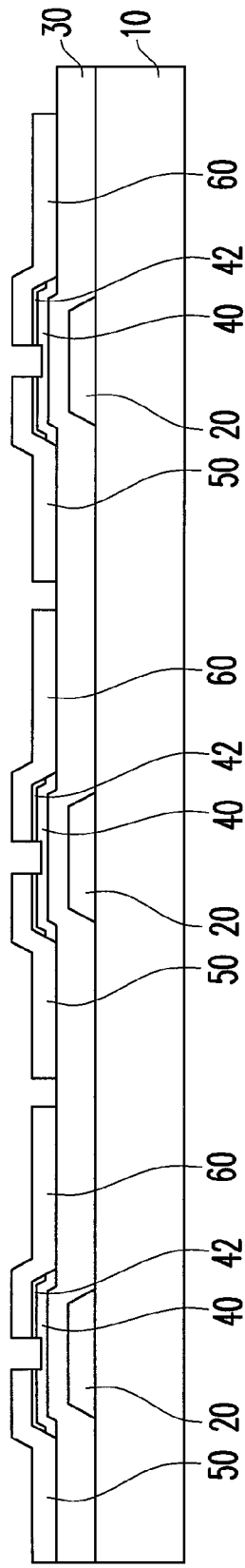
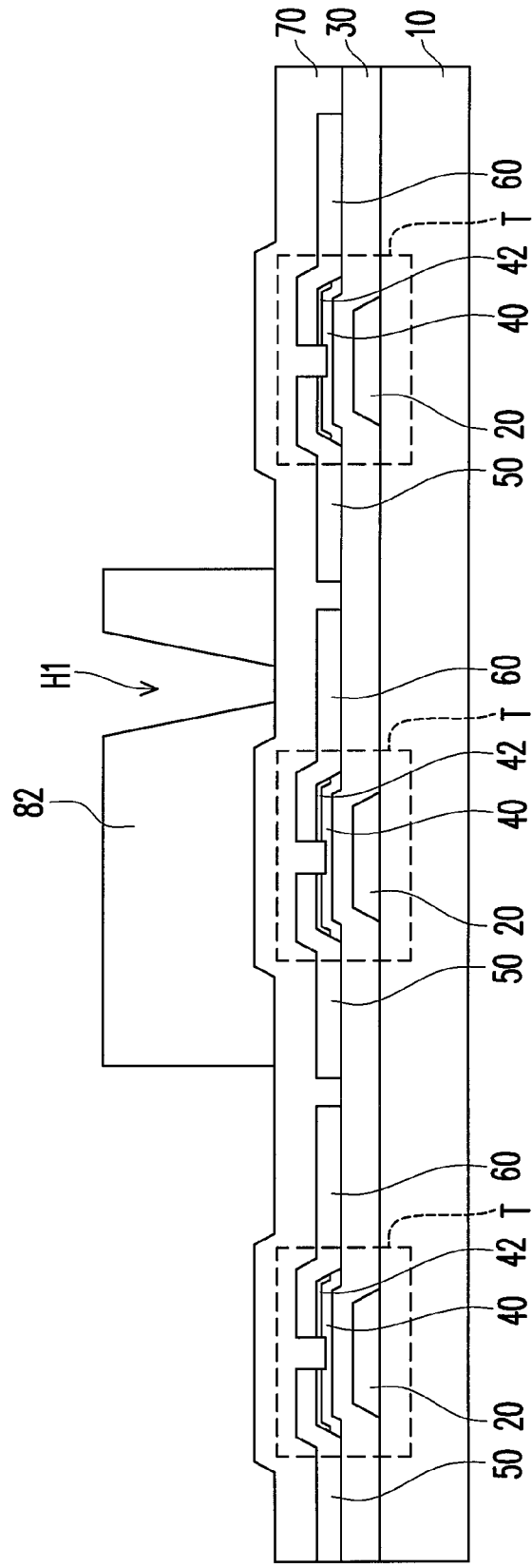
FIG. 1C (PRIOR ART)
FIG. 1D (PRIOR ART)

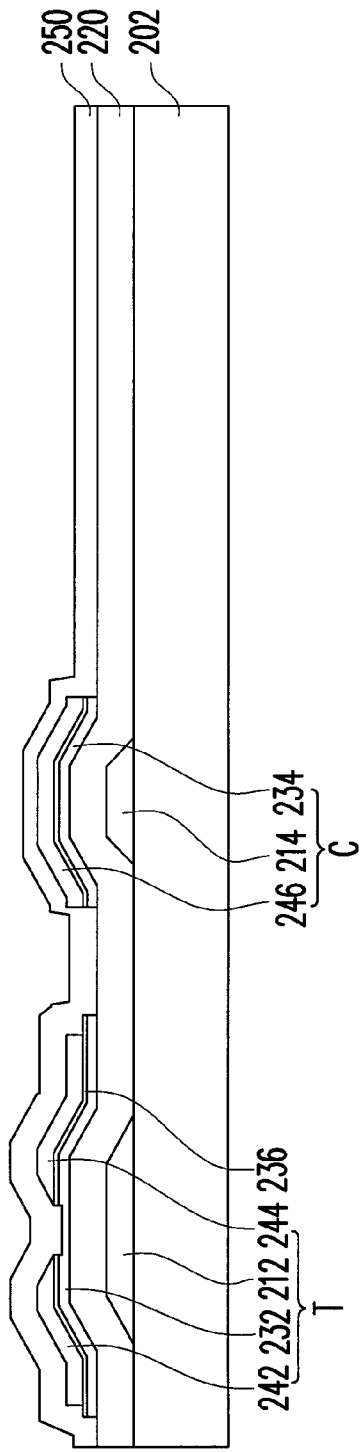
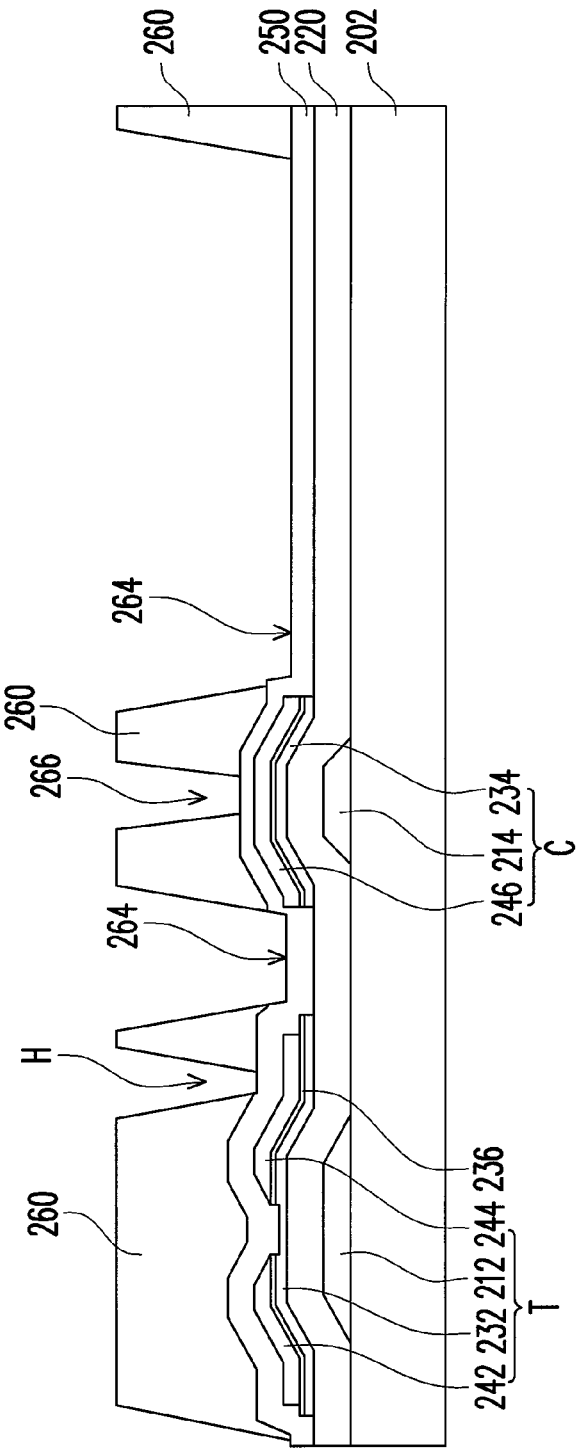

METHOD FOR FABRICATING PIXEL STRUCTURE

CROSS-REFERENCE TO RELATED APPLICATION

This application claims the priority benefit of Taiwan application serial no. 97125586, filed on Jul. 7, 2008. The entirety of the above-mentioned patent application is hereby incorporated by reference herein and made a part of specification.

BACKGROUND OF THE INVENTION

1. Field of the Invention

The present invention generally relates to a method for fabricating a pixel structure, and more particularly, to a method for fabricating a pixel structure having a color filter layer through less photolithography and etching processes (PEP).

2. Description of Related Art

Liquid crystal display (LCD) has replaced cathode ray tube (CRT) display as the mainstream in the display market because of its advantages such as high image quality, small volume, light weight, low driving voltage, low power consumption, and broad application, etc. A conventional LCD panel is composed of a color filter substrate having a color filter layer, a thin film transistor (TFT) array substrate, and a liquid crystal layer disposed between foregoing two substrates. In order to enhance the resolution of the LCD panel and the aperture ratio of the pixels and to avoid alignment error between the color filter substrate and the TFT array substrate, a technique for integrating a color filter layer directly into a TFT array substrate (color filter on array, COA) is further provided.

FIGS. 1A~1G are diagrams illustrating a conventional technique for forming a color filter layer on a TFT array substrate, wherein three pixel structures are illustrated as examples in FIGS. 1A~1H. First, referring to FIG. 1A, a substrate 10 is provided, and a gate 20 is formed on the substrate 10 through a first photolithography and etching process (PEP). Then, referring to FIG. 1B, a gate insulation layer 30 is formed on the substrate 10 to cover the gate 20, and a channel layer 40 and an Ohmic contact layer 42 are formed on the gate insulation layer 30 above the gate 20 through a second PEP. Next, referring to FIG. 1C, a source 50 and a drain 60 are formed on a portion of the channel layer 40 and a portion of the gate insulation layer 30 through a third PEP. Generally speaking, the channel layer 40 is made of amorphous silicon (a-Si), and the Ohmic contact layer 42 is made of N-type heavily-doped a-Si such that the contact resistance between the channel layer 40 and the source 50 and the contact resistance between the channel layer 40 and the drain 60 can be reduced. The Ohmic contact layer 42 is formed by performing N-type ion doping on the surface of a-Si.

Referring to FIG. 1C again, the source 50 and the drain 60 are respectively extended from both sides of the channel layer 40 onto the gate insulation layer 30 and expose a portion of the channel layer 40, wherein the gate 20, the channel layer 40, the source 50, and the drain 60 form a TFT T. Then, referring to FIG. 1D, a dielectric layer 70 covering the TFT T is formed, and a red filter pattern 82 is formed above the TFT T through a fourth PEP, wherein the red filter pattern 82 has a contact opening H1 which is located above the drain 60 of the TFT T corresponding to the red filter pattern 82.

After that, referring to FIG. 1E, a green filter pattern 84 is formed above a portion of the TFT T through a fifth PEP, and a contact opening H2 is formed within the green filter pattern 84, wherein the contact opening H2 is located above the drain 60 of the TFT T corresponding to the green filter pattern 84. Next, referring to FIG. 1F, a blue filter pattern 86 is formed above the remaining TFT T through a sixth PEP, and a contact opening H3 is formed within the blue filter pattern 86, wherein the contact opening H3 is located above the drain 60 of the TFT T corresponding to the blue filter pattern 86. As shown in FIGS. 1D~1F, the color filter layer 80 composed of the red filter pattern 82, the green filter pattern 84, and the blue filter pattern 86 is fabricated through three PEPs.

Thereafter, referring to FIG. 1G, the dielectric layer 70 exposed by the contact openings H1, H2, and H3 is removed through an etching process. After that, a pixel electrode 90 is formed on the color filter layer 80 through a seventh PEP. As shown in FIG. 1G, the pixel electrodes 90 of the pixel structures are electrically connected to the corresponding drains 60 respectively through the contact openings H1, H2, and H3. Up until this procedure, the process for directly integrating the color filter layer 80 into the TFT array substrate is completed.

As described above, the conventional method for fabricating a color filter layer on a TFT array substrate requires at least seven PEPs therefore is very complicated and requires very high fabricating cost. In addition, masks having different patterns are required for fabricating the pixel structure through foregoing at least seven PEPs, and accordingly, the fabricating cost of the pixel structure cannot be reduced due to the high cost of these masks.

SUMMARY OF THE INVENTION

Accordingly, the present invention is directed to a method for fabricating a pixel structure suitable for reducing a fabricating cost thereof.

The present invention provides a pixel structure fabricating method. First, a gate is formed on a substrate. Then, a gate insulation layer is formed on the substrate to cover the gate, and a channel layer, a source, and a drain are simultaneously formed on the gate insulation layer above the gate, wherein the source and the drain are located on a portion of the channel layer, and the gate, the channel layer, the source, and the drain form a thin film transistor (TFT). Next, a passivation layer is formed on the TFT and the gate insulation layer, and a black matrix is formed on the passivation layer, wherein the black matrix has a contact opening located above the drain and a color filter containing opening, and the contact opening and the color filter containing opening expose a portion of the passivation layer. After that, a color filter layer is formed within the color filter containing opening through an inkjet printing process, and a dielectric layer is formed on the black matrix and the color filter layer. Next, the dielectric layer and the passivation layer are patterned to expose the drain. Thereafter, a pixel electrode electrically connected to the drain is formed.

According to an embodiment of the present invention, the step of simultaneously forming the channel layer, the source, and the drain may include following steps. First, a semiconductor layer is formed on the gate insulation layer. Then, a conductive layer is formed on the semiconductor layer. Next, a photoresist layer is formed on the conductive layer above the gate, wherein the photoresist layer includes a first photoresist block and at least a second photoresist block, and the thickness of the first photoresist block is smaller than that of the second photoresist block. After that, a first etching process is performed to the conductive layer with the photoresist layer as a mask. Next, the thickness of the photoresist layer is reduced until the first photoresist block is completely removed. After that, a second etching process is performed to the conductive layer with the remaining second photoresist block as a mask to form the source and the drain from the remaining conductive layer and to form the channel layer form the remaining semiconductor layer. At least one of the first etching process and the second etching process may comprise a wet etching process. In addition, the step of reducing the thickness of the photoresist layer comprises performing a dry etching process, wherein the dry etching process may comprise performing an ashing process.

According to an embodiment of the present invention, the step of simultaneously forming the channel layer, the source, and the drain may include following steps. First, a semiconductor layer is formed on the gate insulation layer. Then, an Ohmic contact layer is formed on the semiconductor layer. Next, a conductive layer is formed on the Ohmic contact layer. After that, a photoresist layer is formed on the conductive layer above the gate, wherein the photoresist layer includes a first photoresist block and at least a second photoresist block, and the thickness of the first photoresist block is smaller than that of the second photoresist block. Next, a first etching process is performed to the conductive layer with the photoresist layer as a mask, and the thickness of the photoresist layer is reduced until the first photoresist block is completely removed. While removing the first photoresist block, a portion of the semiconductor layer and the Ohmic contact layer exposed by the second photoresist block are removed. After that, a second etching process is performed to the conductive layer with the remaining second photoresist block as a mask to form the source and the drain from the remaining conductive layer and to form the channel layer from the remaining semiconductor layer. Besides, a third etching process is performed to the Ohmic contact layer with the remaining second photoresist block as a mask to remove the Ohmic contact layer exposed by the second photoresist block. At least one of the first etching process and the second etching process may comprise a wet etching process. In addition, the step of reducing thickness of the photoresist layer may comprise a dry etching process, wherein the dry etching process may be an ashing process.

According to an embodiment of the present invention, the step of patterning the dielectric layer and the passivation layer may include following steps. First, a photoresist layer is formed on the dielectric layer. Then, a portion of the dielectric layer and a portion of the passivation layer are removed with the photoresist layer as a mask to form a first opening and a second opening respectively in the dielectric layer and the passivation layer, wherein the first opening and the second opening are corresponding to the contact opening.

According to an embodiment of the present invention, the step of forming the pixel electrode may include following steps. First, an electrode material layer is formed on the patterned passivation layer, the black matrix, and the drain. Then, the electrode material layer is patterned.

According to an embodiment of the present invention, a first capacitance electrode is further formed while forming the gate, and a patterned semiconductor and a second capacitance electrode are further formed while forming the channel layer, the source, and the drain, wherein the first capacitance electrode and the second capacitance electrode form a storage capacitor.

According to an embodiment of the present invention, a first capacitance electrode is further formed while forming the gate, wherein the first capacitance electrode and the pixel electrode form a storage capacitor.

According to an embodiment of the present invention, a patterned semiconductor and a second capacitance electrode are further formed while forming the channel layer, the source, and the drain, wherein the second capacitance electrode and the pixel electrode form a storage capacitor.

According to an embodiment of the present invention, the dielectric layer substantially covers two sidewalls of the black matrix adjacent to the contact opening.

According to an embodiment of the present invention, the dielectric layer does not cover two sidewalls of the black matrix adjacent to the contact opening.

In the present invention, the channel layer, source, and drain of a TFT are formed simultaneously through a single photolithography and etching process (PEP), and the color filter layer is fabricated above the TFT through an inkjet printing process. Thereby, compared to the conventional method for fabricating a pixel structure, the method in the present invention has simplified process and reduced fabricating cost of masks. In addition, the material used for forming the color filter layer can be effectively reduced by forming the color filter layer through the inkjet printing process, and accordingly the fabricating cost of the pixel structure can be further reduced.

BRIEF DESCRIPTION OF THE DRAWINGS

The accompanying drawings are included to provide a further understanding of the invention, and are incorporated in and constitute a portion of this specification. The drawings illustrate embodiments of the invention and, together with the description, serve to explain the principles of the invention.

FIGS. 1A~1G are diagrams illustrating a conventional technique for forming a color filter layer on a thin film transistor (TFT) array substrate.

FIGS. 2A~2G are diagrams illustrating a method for fabricating a pixel structure according to an embodiment of the present invention.

FIGS. 2H and 2I illustrate two pixel structures having different types of storage capacitors.

DESCRIPTION OF THE EMBODIMENTS

Figure 1A:
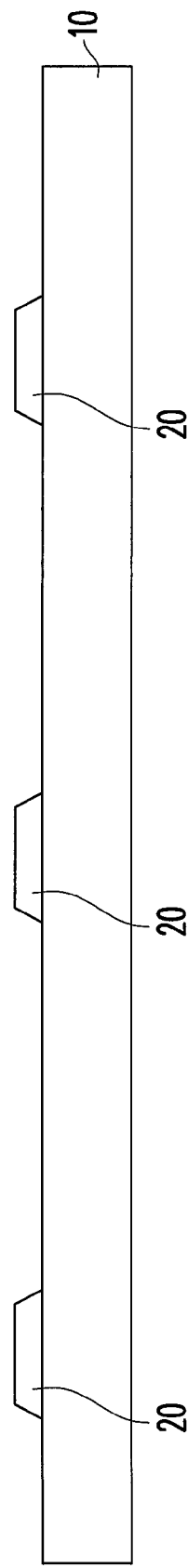
Figure 1B:
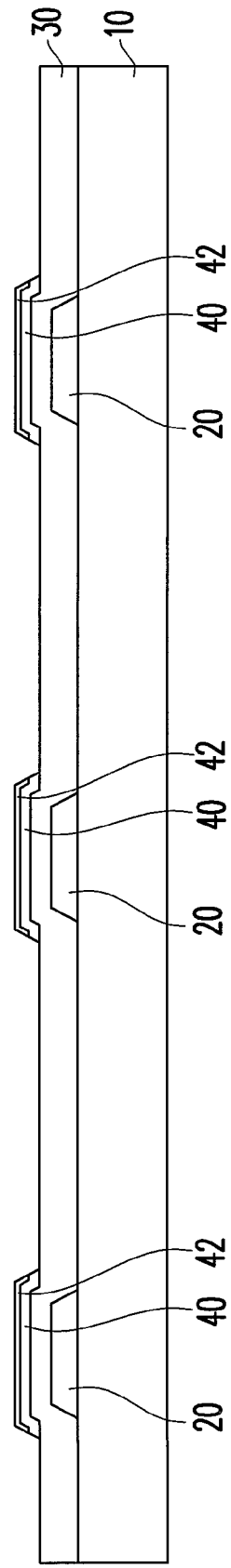
Figure 1E:
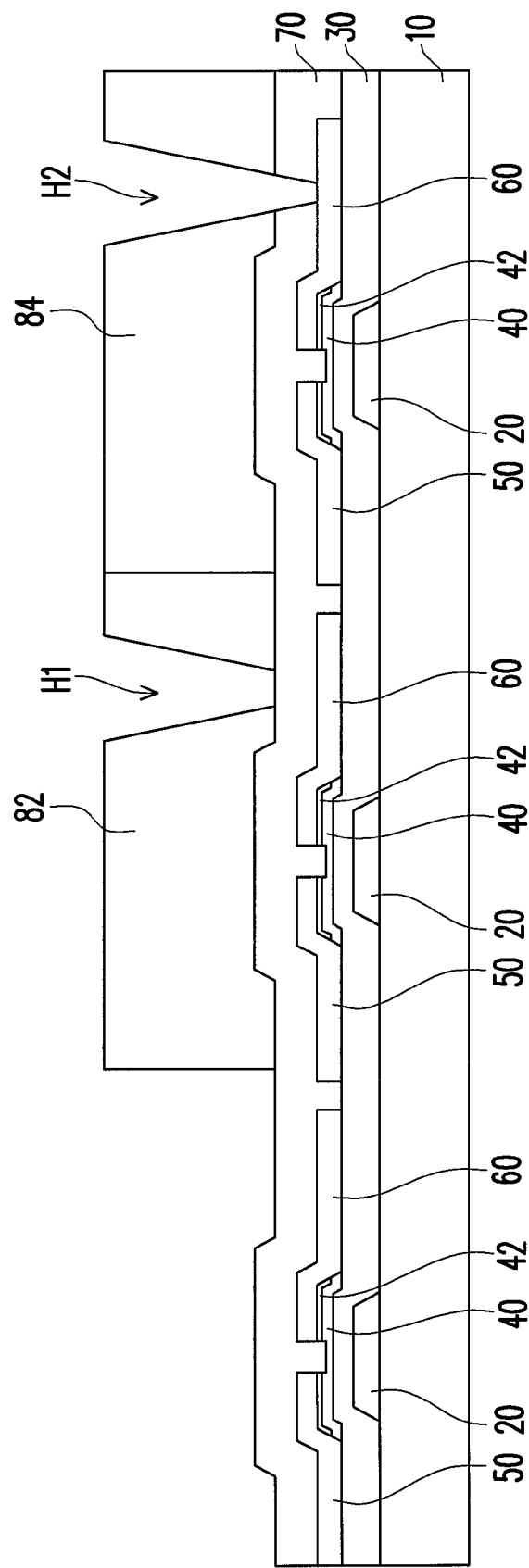
Figure 1F:
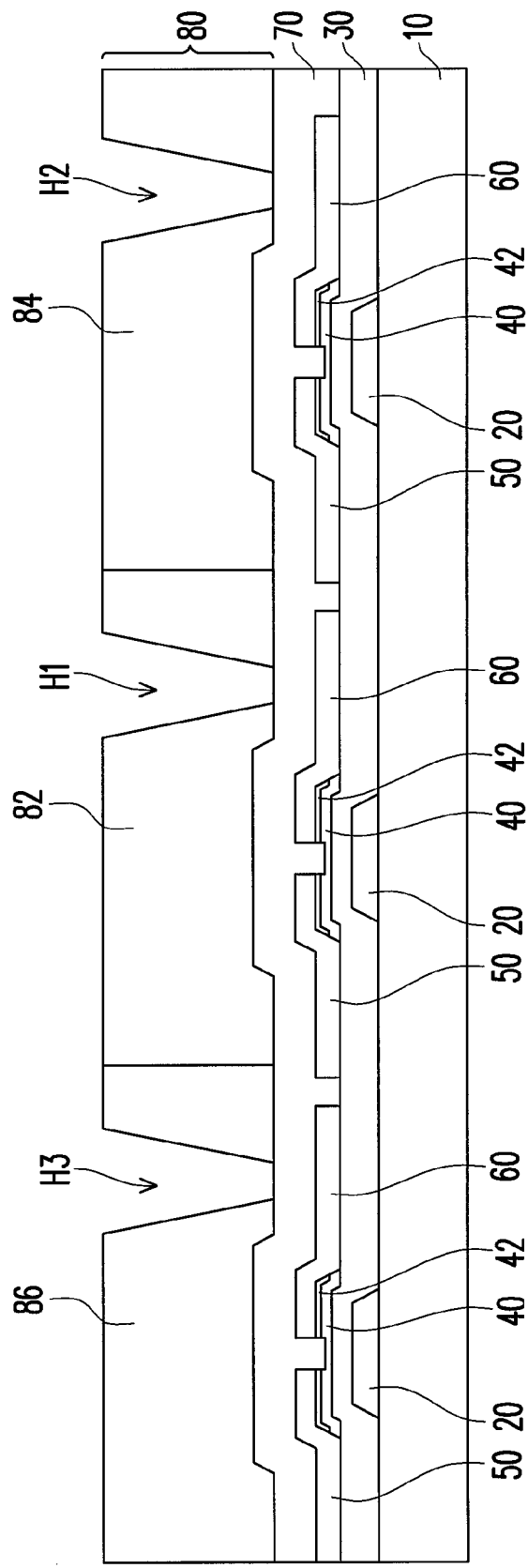
Figure 1G:
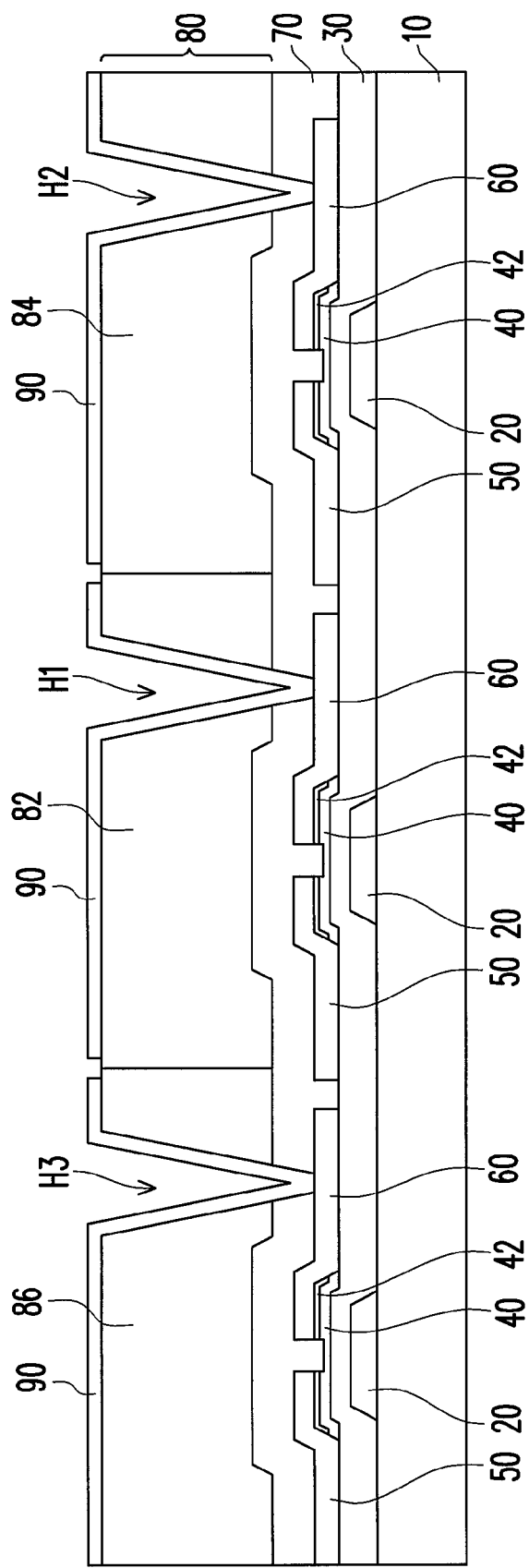

Reference will now be made in detail to the present preferred embodiments of the invention, examples of which are illustrated in the accompanying drawings. Wherever possible, the same reference numbers are used in the drawings and the description to refer to the same or like parts.

Figure 2A:
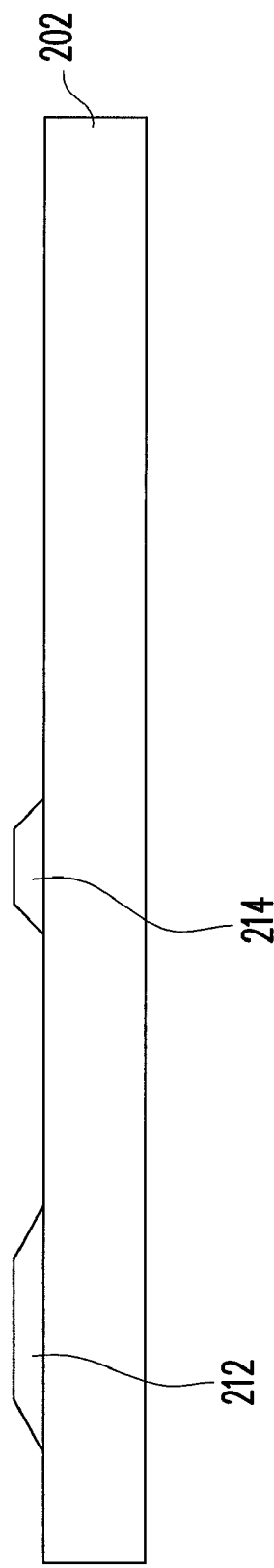

FIGS. 2A~2G are diagrams illustrating a method for fabricating a pixel structure according to an embodiment of the present invention. Referring to FIG. 2A, first, a substrate 202 is provided, wherein the substrate 202 may be made of a hard material or a soft material, such as glass or plastic. Then, a gate 212 is formed on the substrate 202. The gate 212 may be formed by forming a conductive layer (not shown) on the substrate 202 first and then patterning the conductive layer (not shown), wherein the conductive layer may be formed through sputtering, evaporation, or other film deposition techniques, and the conductive layer may be patterned through a photolithography and etching process (PEP). Besides, in the present embodiment, a first capacitance electrode 214 may be selectively formed while forming the gate 212.

Figure 2B:
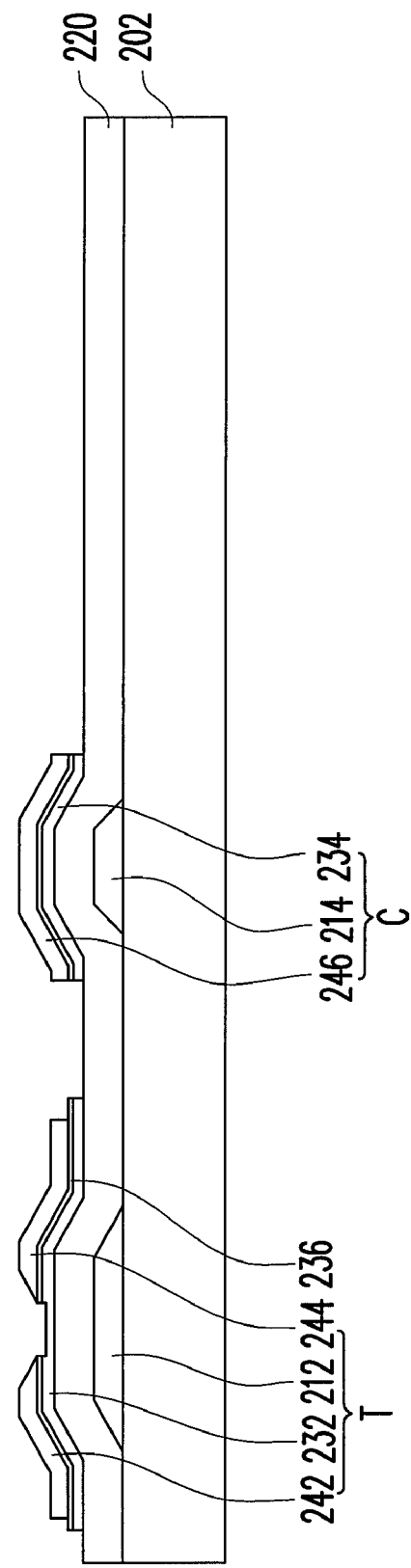

Next, referring to FIG. 2B, a gate insulation layer 220 is formed on the substrate 202 to cover the gate 212 and the first capacitance electrode 214, wherein the gate insulation layer 220 may be formed through chemical vapour deposition (CVD) or other suitable film deposition techniques, and the gate insulation layer 220 may be made of a dielectric material, such as SiO, SiN, or SiON. Thereafter, as shown in FIG. 2B, a channel layer 232, a source 242, and a drain 244 are simultaneously formed on the gate insulation layer 220 above the gate 212, wherein the channel layer 232 may be made of amorphous silicon (a-Si) or other semiconductor materials. In addition, the source 242 and the drain 244 may be made of Cu, Al, Mo, Ti, Nd, a nitrid of foregoing metals, such as MoN or TiN, a stack layer thereof, an alloy thereof, or other conductive materials. It should be noted that in the present invention, the channel layer 232, the source 242, and the drain 244 are simultaneously formed and the patterns thereof are conformal. Thus, less PEPs are performed and the fabricating process is simplified.

Referring to FIG. 2B again, the source 242 and the drain 244 are located on a portion of the channel layer 232, and the gate 212, the channel layer 232, the source 242l, and the drain 244 form a thin film transistor (TFT) T. In the present embodiment, a patterned semiconductor 234 and a second capacitance electrode 246 may be selectively formed while forming the channel layer 232, the source 242, and the drain 244, wherein the first capacitance electrode 214 and the second capacitance electrode 246 form a storage capacitor C. It should be mentioned herein that in order to improve the device characteristics of the TFT T, in the present embodiment, an Ohmic contact layer 236 may be formed between the channel layer 232 and the source 242 and between the channel layer 232 and the drain 244 to reduce the contact resistance between the channel layer 232 and the source 242 and the contact resistance between the channel layer 232 and the drain 244; however, the present invention is not limited thereto. The Ohmic contact layer 236 may be made of N-type heavily-doped a-Si. The method for simultaneously forming the channel layer 232, the source 242, and the drain 244 will be described with reference to FIGS. 3A~3D.

Referring to FIG. 2C, a passivation layer 250 which covers the TFT T and the gate insulation layer 220 is formed on the substrate 202, wherein the passivation layer 250 may be made of an organic dielectric material, such as acrylic resin or photosensitive resin, and the passivation layer 250 may also be made of an inorganic dielectric material, such as SiO, SiN, or SiON. To be more specific, the passivation layer 250 is usually formed through spin coating process when the material of passivation layer 250 is chosen from an organic dielectric material, and the passivation layer 250 is usually deposited on the substrate 202 through physical vapour deposition (PVD) or CVD when the material of passivation layer 250 is chosen form an inorganic dielectric material.

Referring to FIG. 2D, a black matrix 260 is formed on the passivation layer 250, wherein the black matrix 260 may be made of black resin. As shown in FIG. 2D, the black matrix 260 has a contact opening H and a color filter containing opening 264. The contact opening H is located above the drain 244. The contact opening H and the color filter containing opening 264 expose a portion of the passivation layer 250. To be more specific, the black matrix 260 may be formed by forming a material layer on the passivation layer 250 first and then patterning the material layer, wherein the material layer may be coated on the passivation layer 250 through spin coating, slit/spin coating, or spin-less coating, and the step of patterning the material layer includes, for example, soft baking, exposing, developing, and hard baking the material layer.

In addition, in the present embodiment, the black matrix 260 has an opening 266 which exposes the second capacitance electrode 246.

Figure 2E:
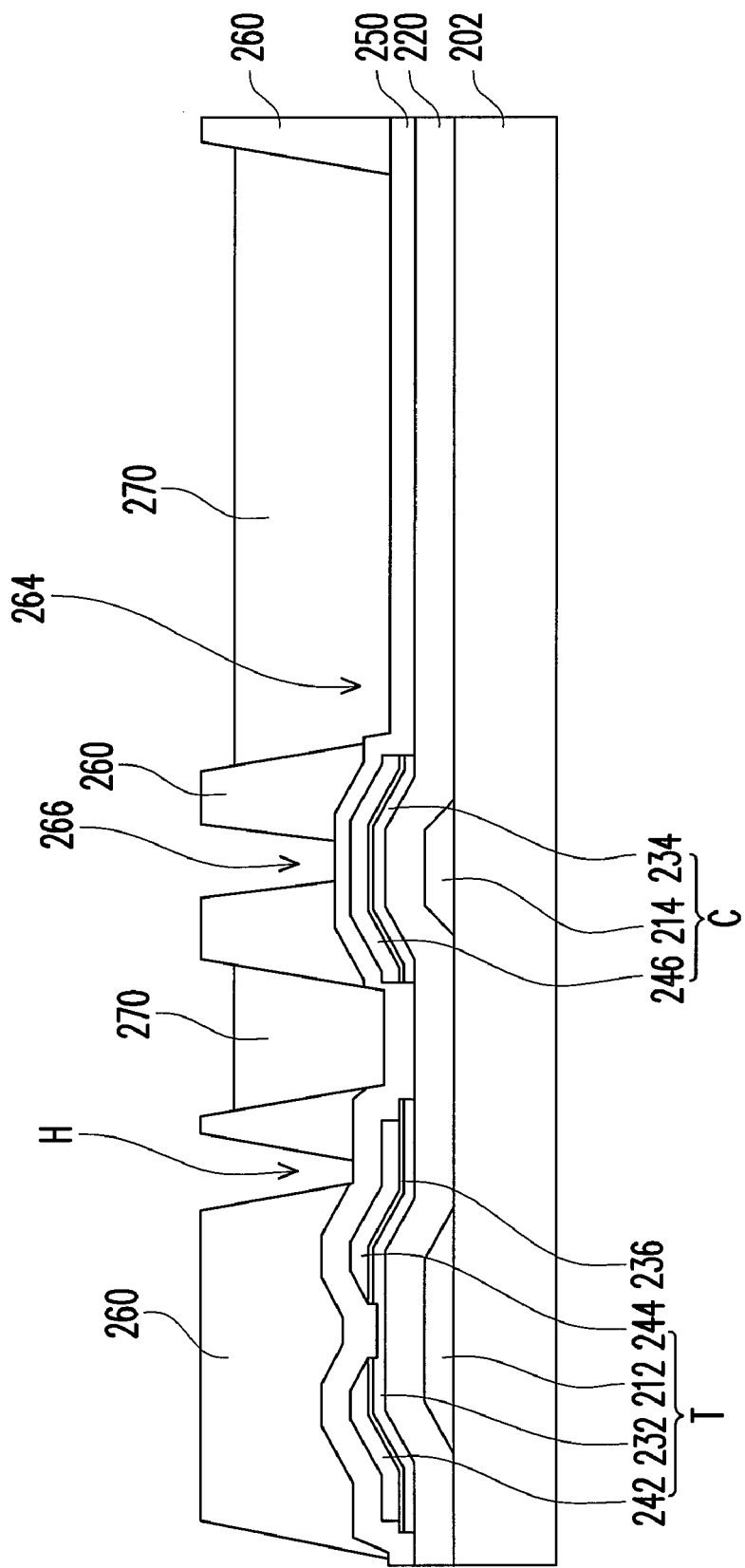

Referring to FIG. 2E, a color filter layer 270 is formed within the color filter containing opening 264 through an inkjet printing process, wherein the color filter layer 270 may be made of acrylic resin. Substantially, in the technique for directly integrating the color filter layer into a TFT array substrate, each pixel structure has a color filter layer 270 located above the TFT T, and the color filter layer 270 may include a red filter pattern, a green filter pattern, and a blue filter pattern to allow an LCD panel to achieve a full-color display effect.

To be more specific, in the present embodiment, the color filter layer 270 may be a red filter pattern, a green filter pattern, or a blue filter pattern. Besides, the inkjet printing process may include following steps. First, a surface treatment is performed to the substrate 202, and then, a nozzle filled with red, green, or blue ink is used for filling the ink into the predetermined red, green, or blue color filter containing opening 264. After that, a baking process is performed for curing the ink and form the color filter layer 270. It should be noted that in the present embodiment, the red filter pattern, green filter pattern, and blue filter pattern can be formed simultaneously in the pixel structures of an LCD panel without performing any PEP. Thus, the fabricating cost can be greatly reduced, the fabricating process can be simplified, and accordingly the production yield can be improved. However, the color, number, and disposition of the color filter patterns are not limited in the present invention; instead, they can be adjusted according to the actual requirement.

Figure 2F:
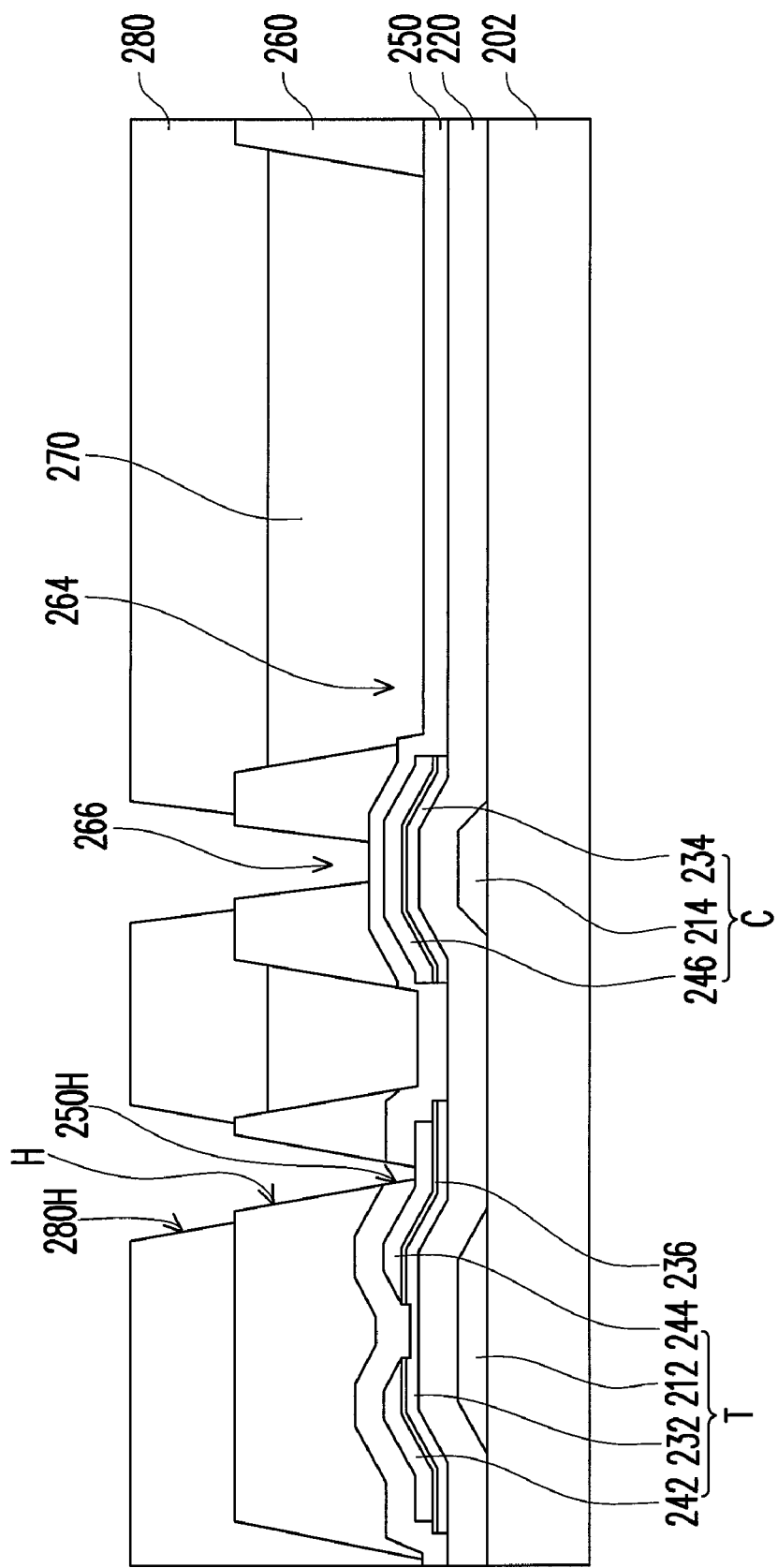
Figure 2F:
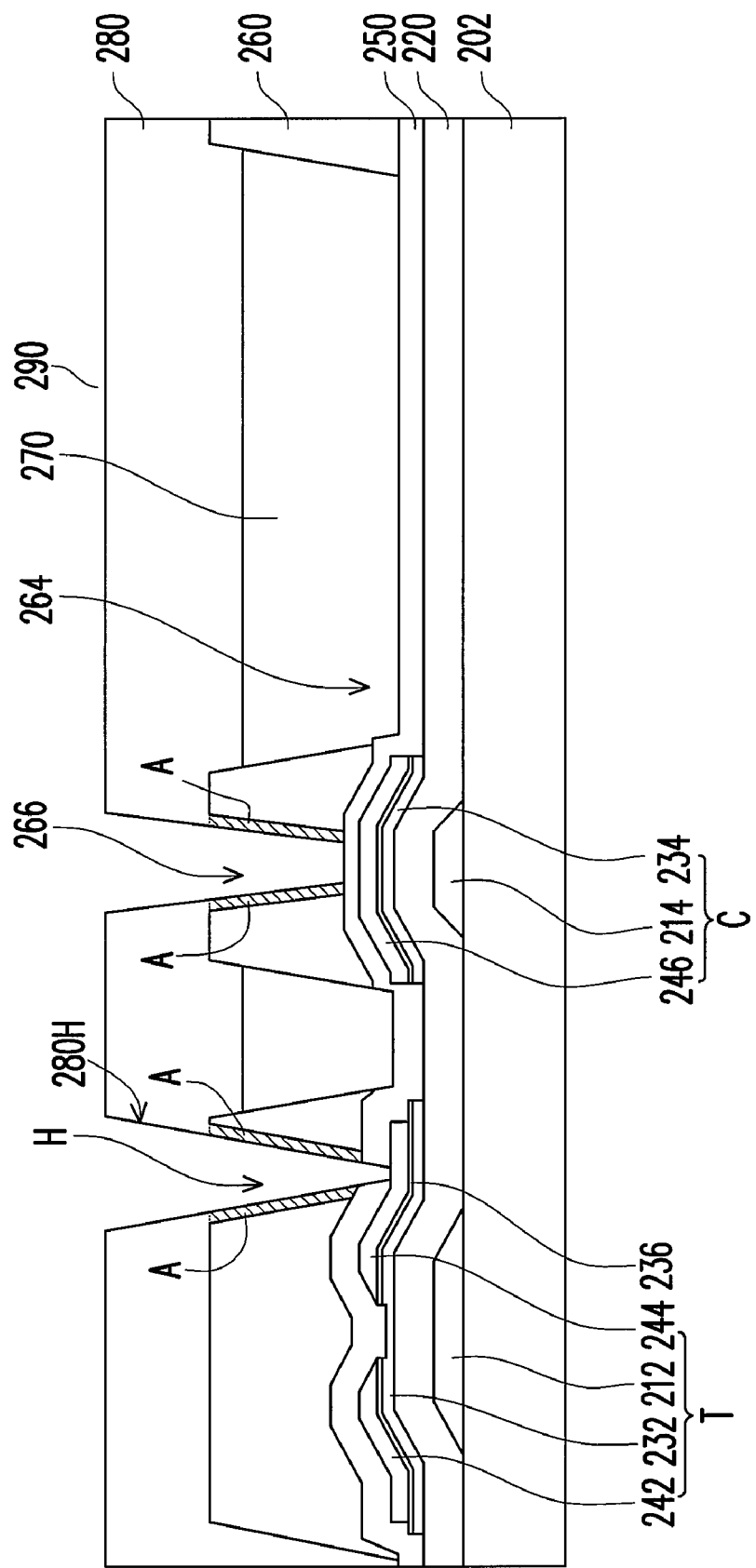

Referring to FIG. 2F, a dielectric layer 280 is formed on the black matrix 260 and the color filter layer 270, wherein the dielectric layer 280 may be made of an organic dielectric material, such as acrylic resin or photosensitive resin, through spin coating. The dielectric layer may also be made of an inorganic dielectric material, such as SiO, SiN, or SiON, through CVD or other suitable film deposition techniques. As shown in FIG. 2F, the dielectric layer 280 and the passivation layer 250 are patterned to expose the drain 244, wherein the method for patterning the dielectric layer 280 and the passivation layer 250 may include following steps. First, a photoresist layer (not shown) is formed on the dielectric layer 280, wherein the photoresist layer (not shown) is patterned. Then, a portion of the dielectric layer 280 and a portion of the passivation layer 250 are removed with the photoresist layer (not shown) as a mask to respectively form a first opening 280H and a second opening 250H in the dielectric layer 280 and the passivation layer 250, wherein the first opening 280H and the second opening 250H are corresponding to the contact opening H.

As shown in FIG. 2F, the second opening 250H of the passivation layer 250 is located within the range of the first opening 280H of the dielectric layer 280. To be specific, in the present embodiment, the dielectric layer 280 does not cover two sidewalls of the contact opening H. In another embodiment of the present invention, the layout of the dielectric layer 280 and the passivation layer 250 may also be as shown in FIG. 2F', wherein the dielectric layer 280 is extended into a portion of the contact opening H, as denoted by the lined part A in FIG. 2F'. In other words, the dielectric layer 280 covers two sidewalls of the contact opening H. The shapes of the openings in the dielectric layer 280 and the passivation layer 250 corresponding to the contact opening H are not limited in the present invention.

Figure 2G:
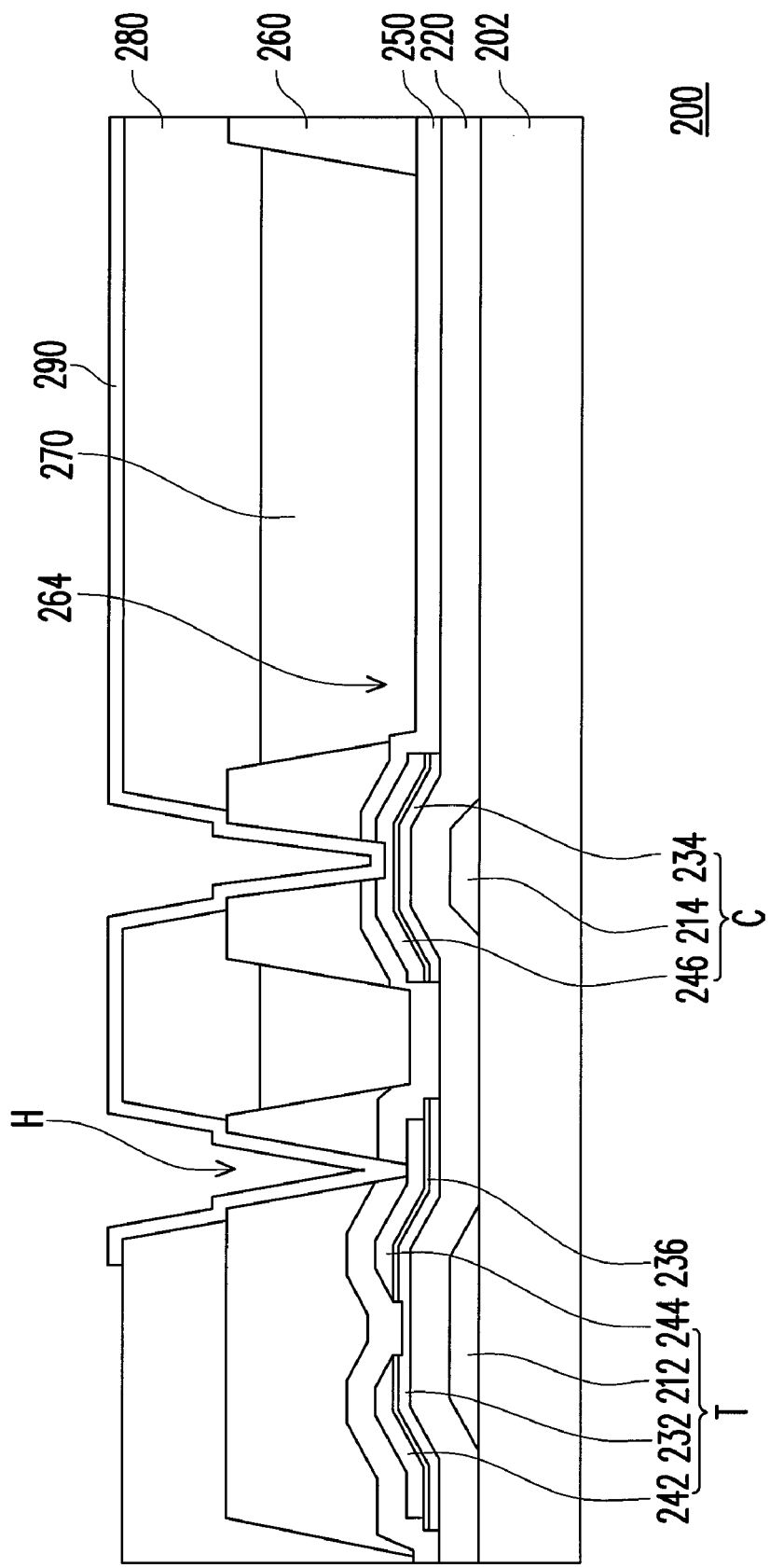

Referring to FIG. 2G, a pixel electrode 290 electrically connected to the drain 244 is formed. In the present embodiment, the pixel electrode 290 is electrically connected to the second capacitance electrode 246 through the opening 266 of the black matrix 260 so that the first capacitance electrode 214, the gate insulation layer 220, the second capacitance electrode 246, and the pixel electrode 290 form a storage capacitor.

Additionally, the pixel electrode 290 may be formed through following steps. First, an electrode material layer (not shown) is formed on the patterned passivation layer 250, the black matrix 260, and the drain 244, and then the electrode material layer (not shown) is patterned, wherein the electrode material layer may be an ITO layer or an IZO layer formed through sputtering. A pixel structure 200 is fabricated through the steps illustrated in FIGS. 2A~2G. It should be noted that unlike the conventional technique wherein at least seven PEPs are required for fabricating the pixel electrode 290, the color filter layer 270 can be directly integrated into the TFT T array substrate 202 through only four PEPs and an inkjet printing process in the present invention. Compared to the conventional technique, less PEPs are performed and the fabricating process is simplified in the present invention. Besides, the material used for forming the color filter layer 270 is effectively reduced, and accordingly the material cost is reduced.

Figure 2H:
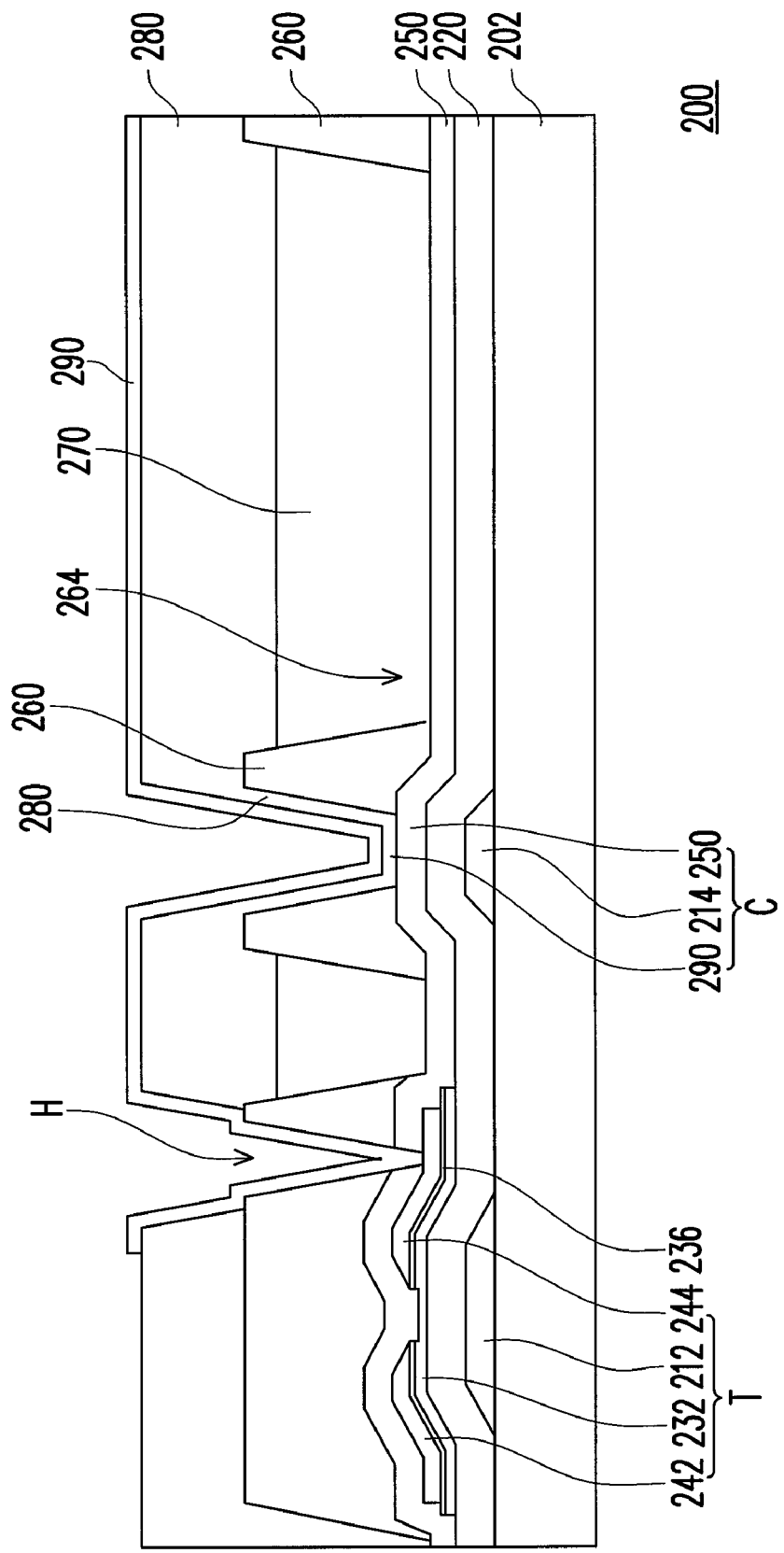
Figure 21:
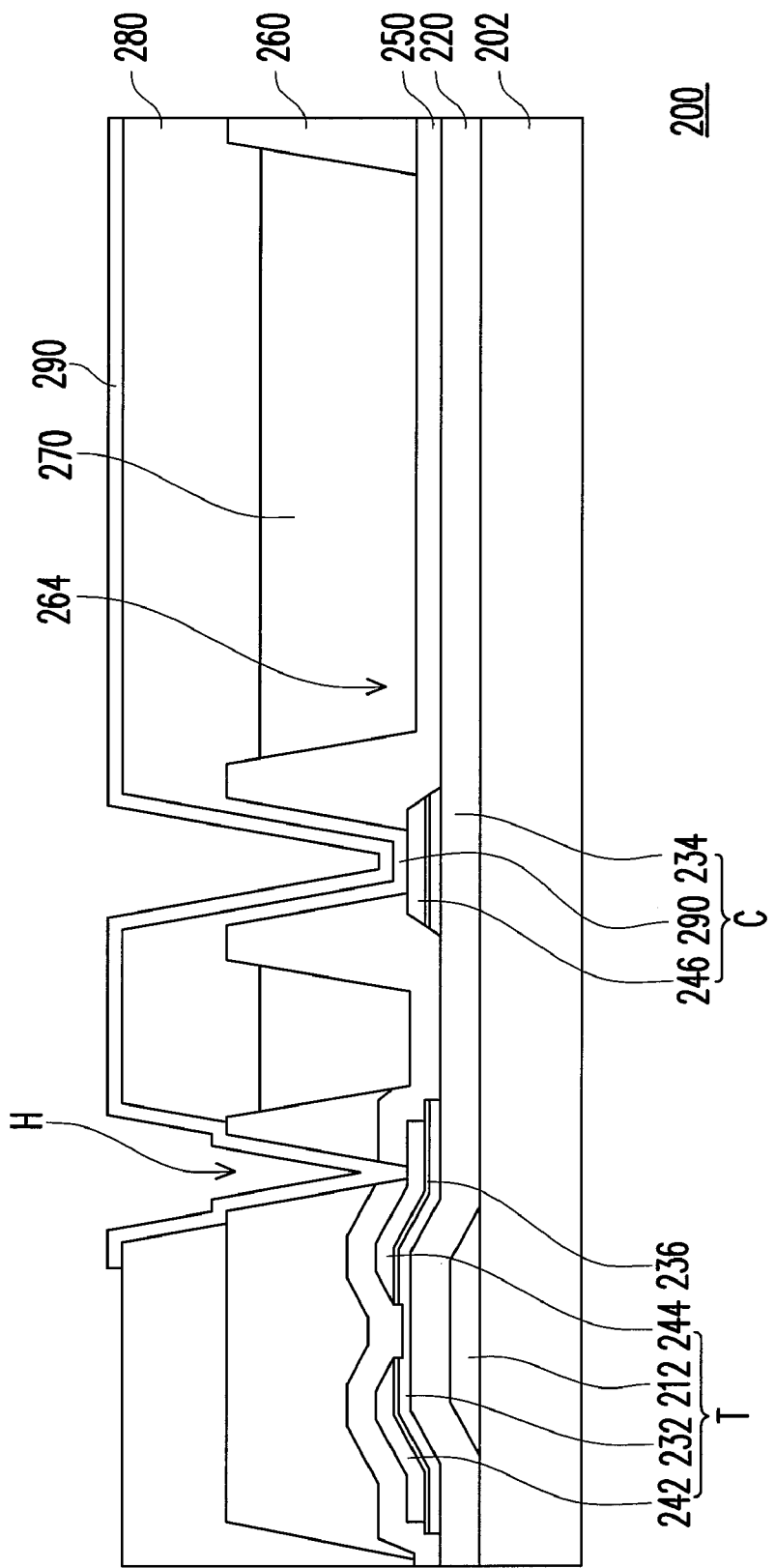

It should be mentioned that the storage capacitor C in the embodiment described above is a metal/insulator/metal (MIM) storage capacitor. However, the present invention is not limited thereto, and the storage capacitor in the pixel structure may also be another type of storage capacitor, such as a metal/insulator/ITO (MII) storage capacitor. FIG. 2H and FIG. 2I illustrate two pixel structures having different types of storage capacitors, and for the convenience of description, the elements same as those in FIG. 2G will not be described herein. As shown in FIG. 2H, the storage capacitor C is formed by the first capacitance electrode 214, the gate insulation layer 220, the passivation layer 250, and the pixel electrode 290, or by the first capacitance electrode 214, the gate insulation layer 220, the passivation layer 250, the dielectric layer 280, and the pixel electrode 290. As shown in FIG. 2I, the storage capacitor C is formed by the second capacitance electrode 246, the passivation layer 250, and the pixel electrode 290. However, the dielectric layer between the second capacitance electrode 246 and the pixel electrode 290 may also be formed by the passivation layer 250 and the dielectric layer 280. Substantially, a voltage level is provided to the second capacitance electrode 246 by an external power supply to form a storage capacitor C between the second capacitance electrode 246 and the pixel electrode 290.

Figure 3A:
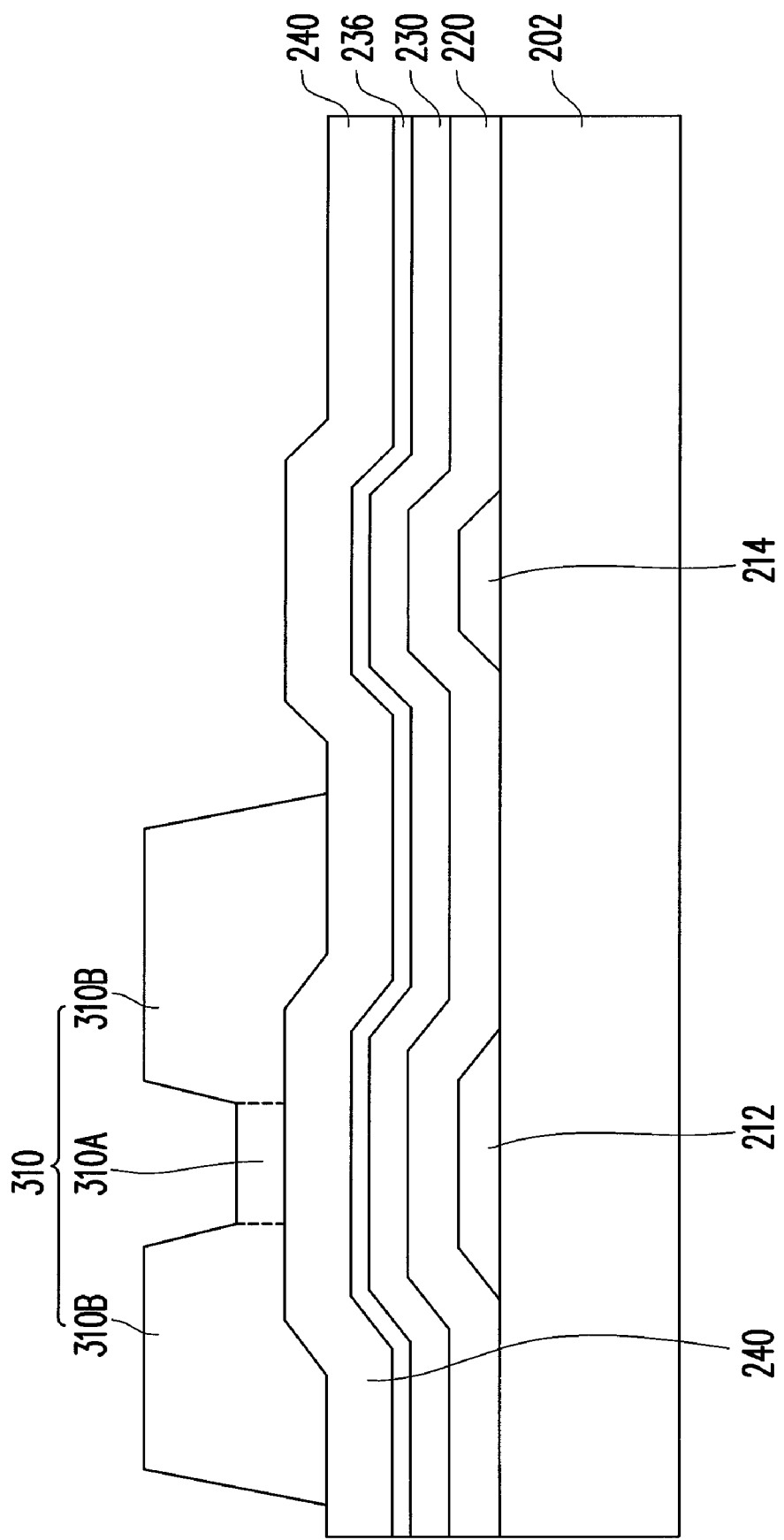
FIGS. 3A~3E are diagrams illustrating a method for simultaneously forming a channel layer, a source, and a drain.
Figure 3B:
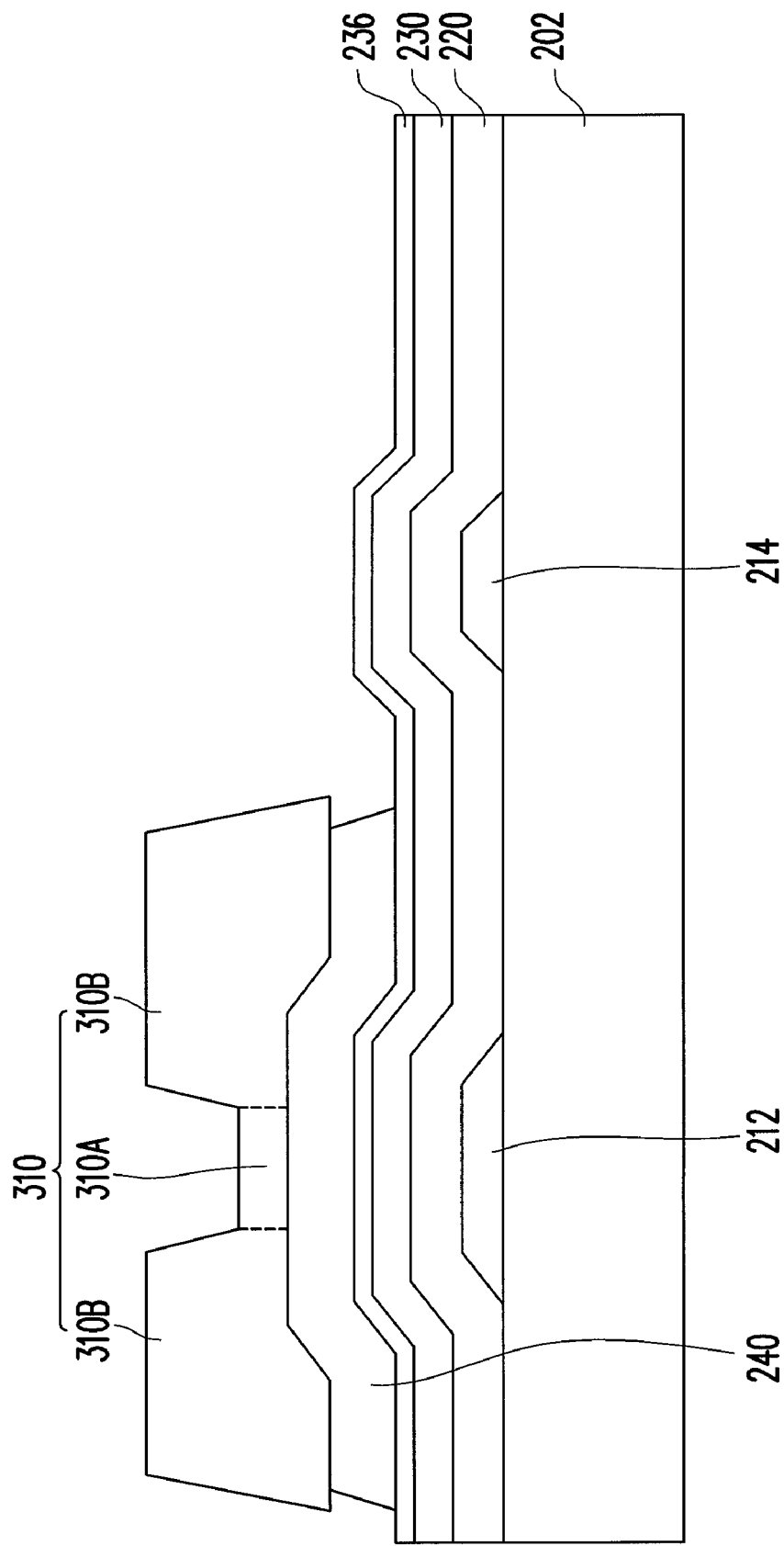

FIGS. 3A~3E are diagrams illustrating a method for simultaneously forming a channel layer, a source, and a drain. As shown in FIG. 3A, a semiconductor layer 230, the Ohmic contact layer 236, and a conductive layer 240 are sequentially formed on the gate insulation layer 220 after the gate insulation layer 220 is formed, and a photoresist layer 310 is formed on the conductive layer 240 above the gate 212, wherein the photoresist layer 310 includes a first photoresist block 310A and a second photoresist block 310B located at both sides of the first photoresist block 310A, and the thickness of the first photoresist block 310A is smaller than that of the second photoresist block 310B. In the present embodiment, the first photoresist block 310A and the second photoresist block 310B may be formed through a half-tone mask process or a gray-tone mask process. After that, referring to FIG. 3B, a first etching process is performed to the conductive layer 240 with the photoresist layer 310 as a mask to remove the conductive layer 240 not covered by the photoresist layer 310, wherein the first etching process may be wet etching process.

Figure 3C:
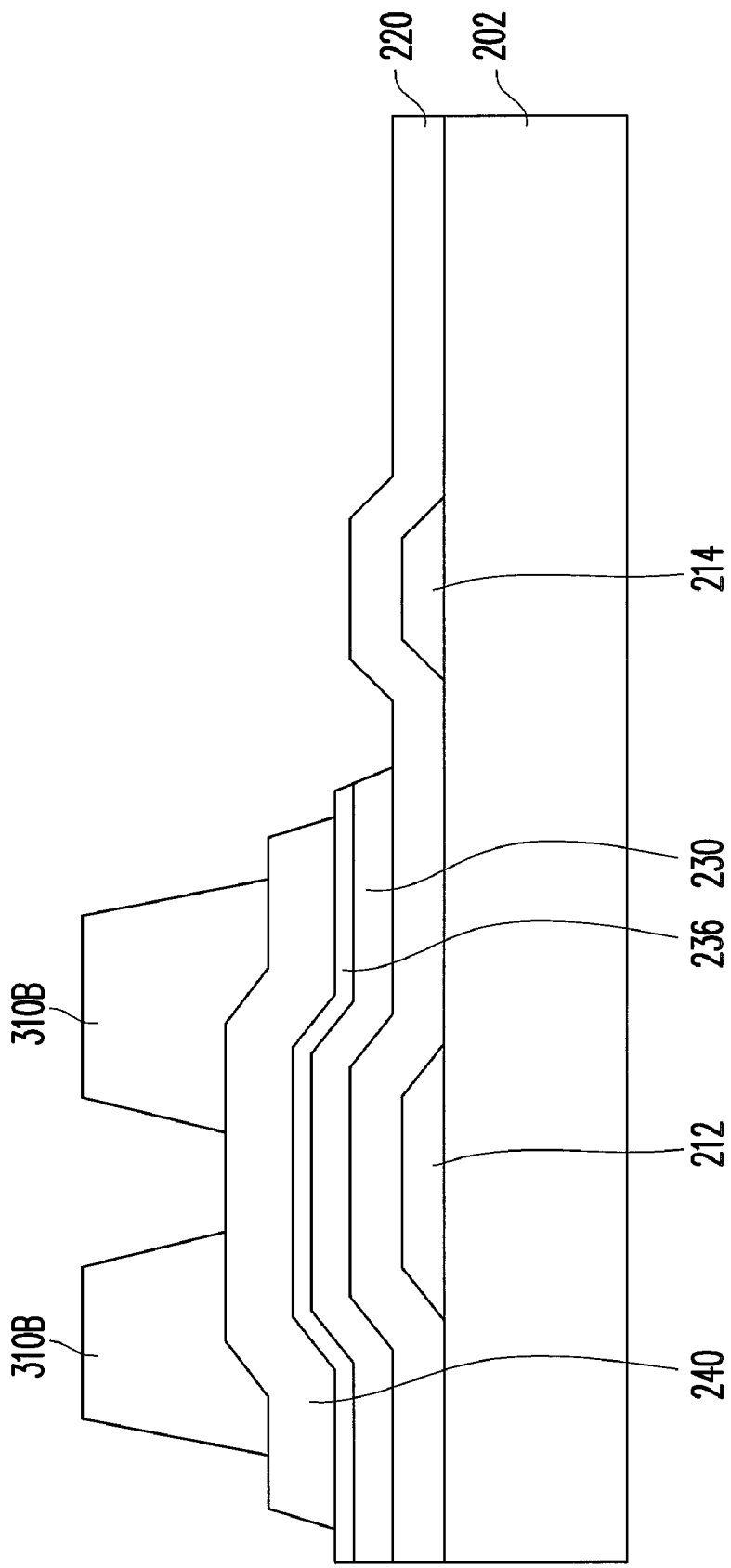

Referring to FIG. 3C, reducing the thickness of the photoresist layer 310 until the first photoresist block 310A is completely removed, wherein the thickness of the photoresist layer 310 may be reduced through a dry etching process, such as an ashing process. It should be mentioned that while removing the first photoresist block 310A, the semiconductor layer 230 and the Ohmic contact layer 236 not covered by the second photoresist block 310B may also be removed through the dry etching process, in other words the semiconductor layer 230 and the Ohmic contact layer 236 not covered by the photoresist layer 310 may also be removed through the dry etching process simultaneously while the first photoresist block 310A is removed.

Figure 3D:
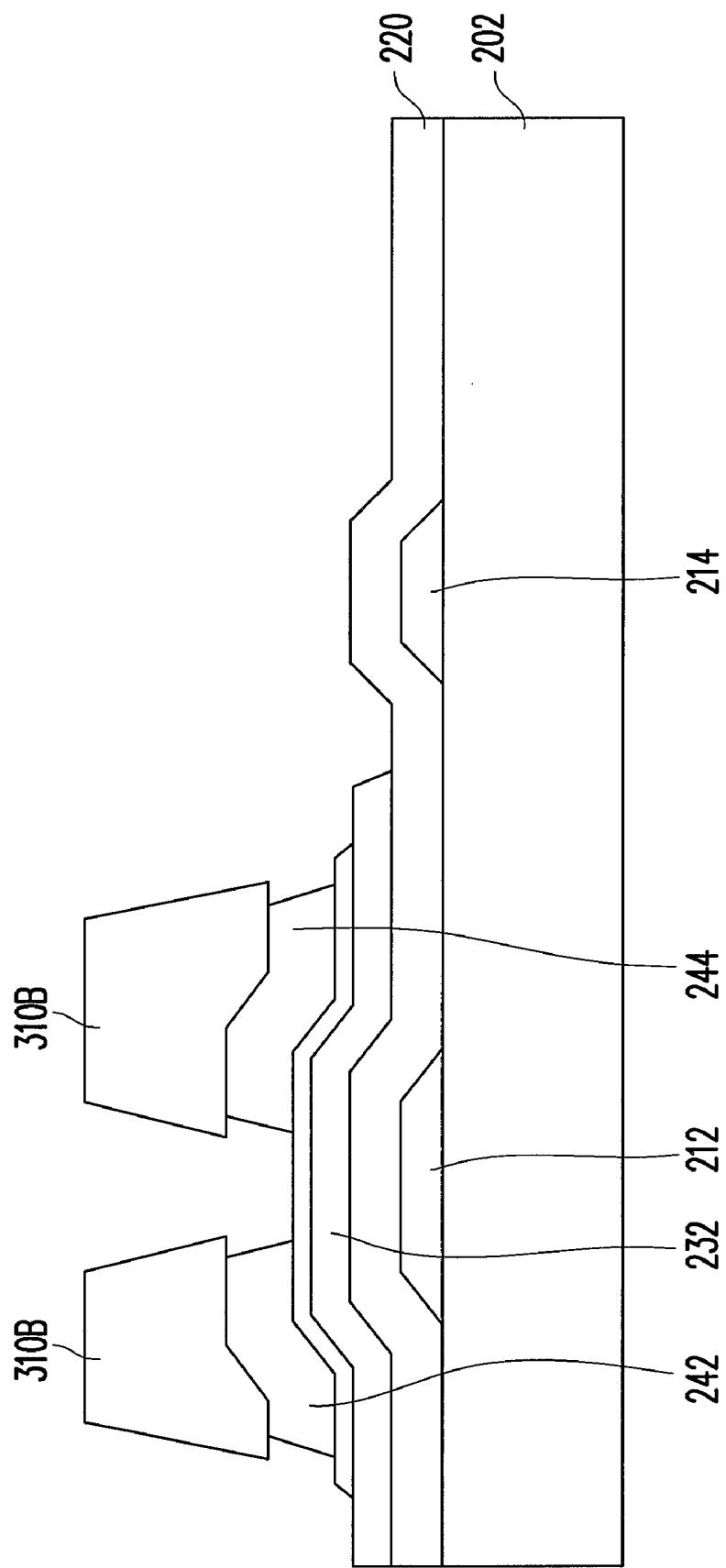
Figure 3E:
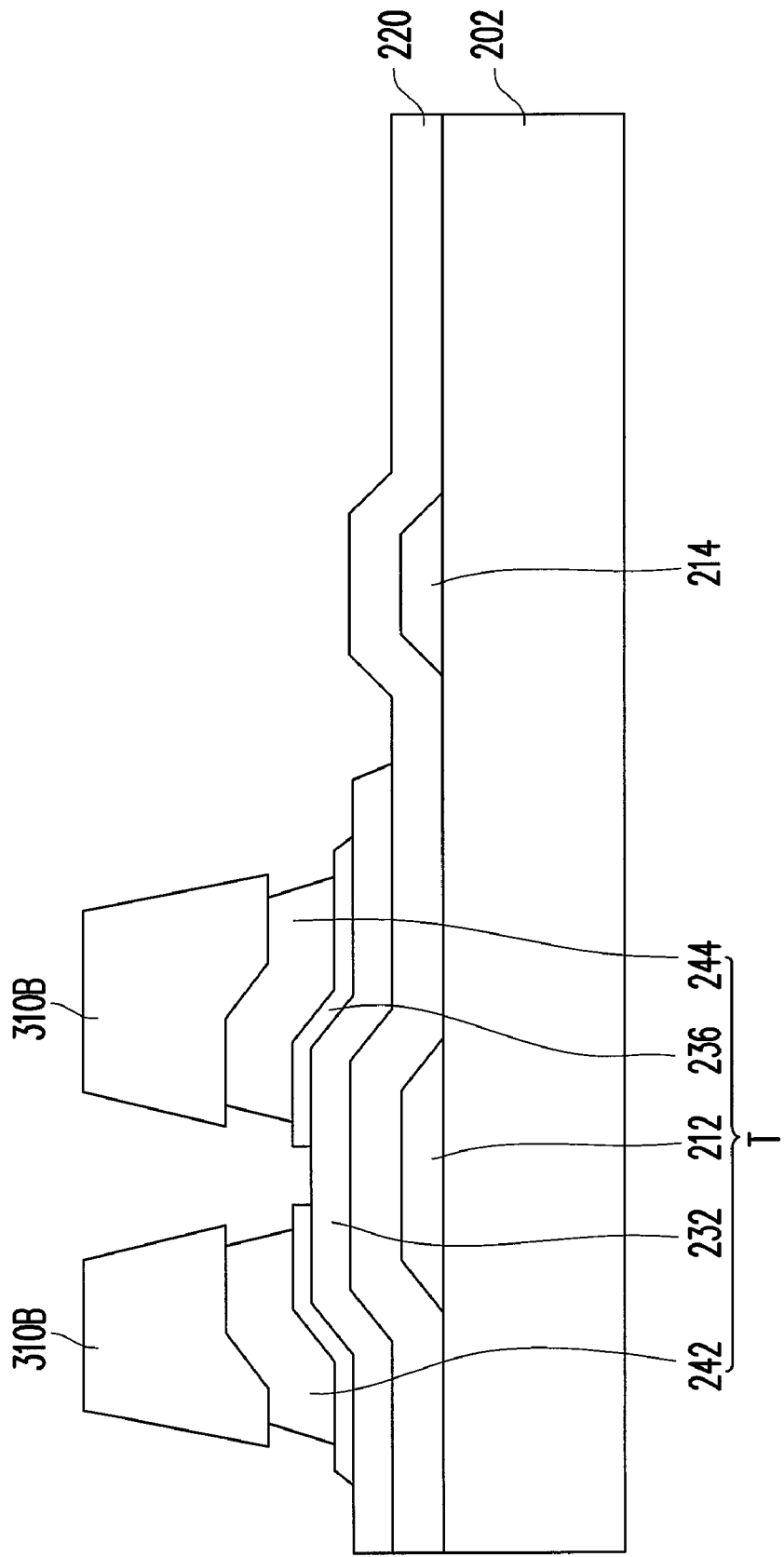
Figure 4A:
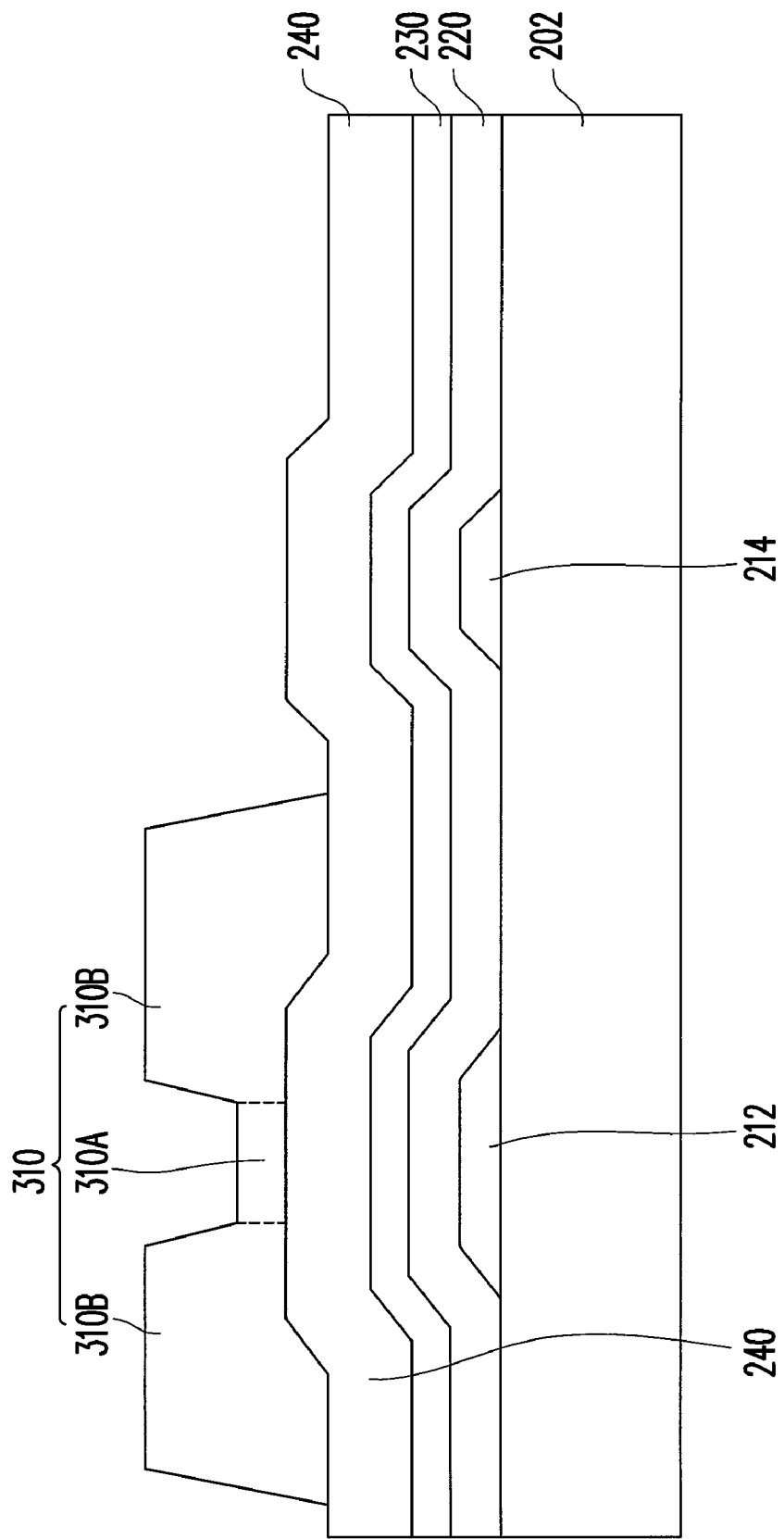
FIGS. 4A~4D are diagrams illustrating another method for simultaneously forming a channel layer, a source, and a drain.
Figure 4B:
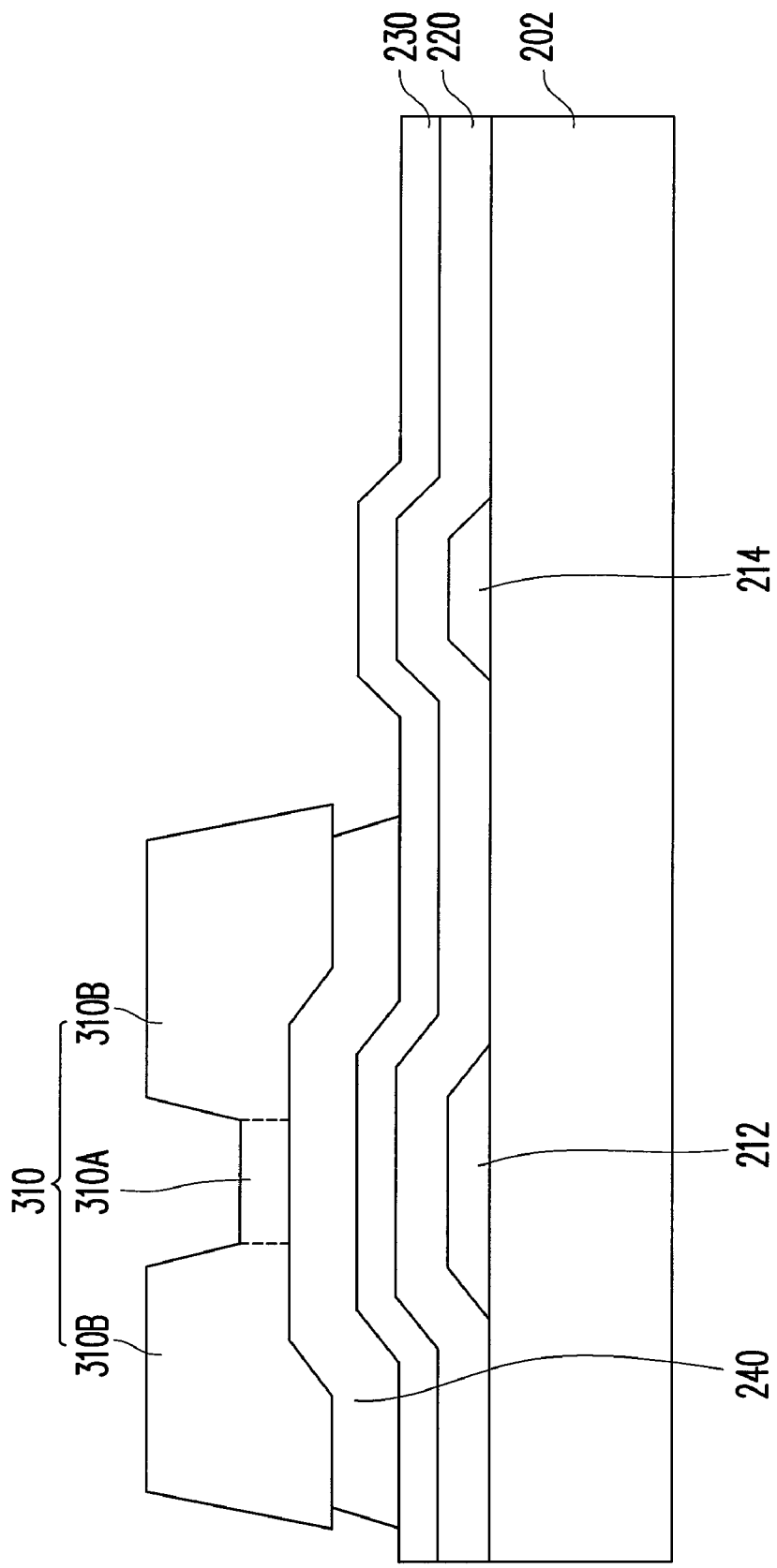
Figure 4C:
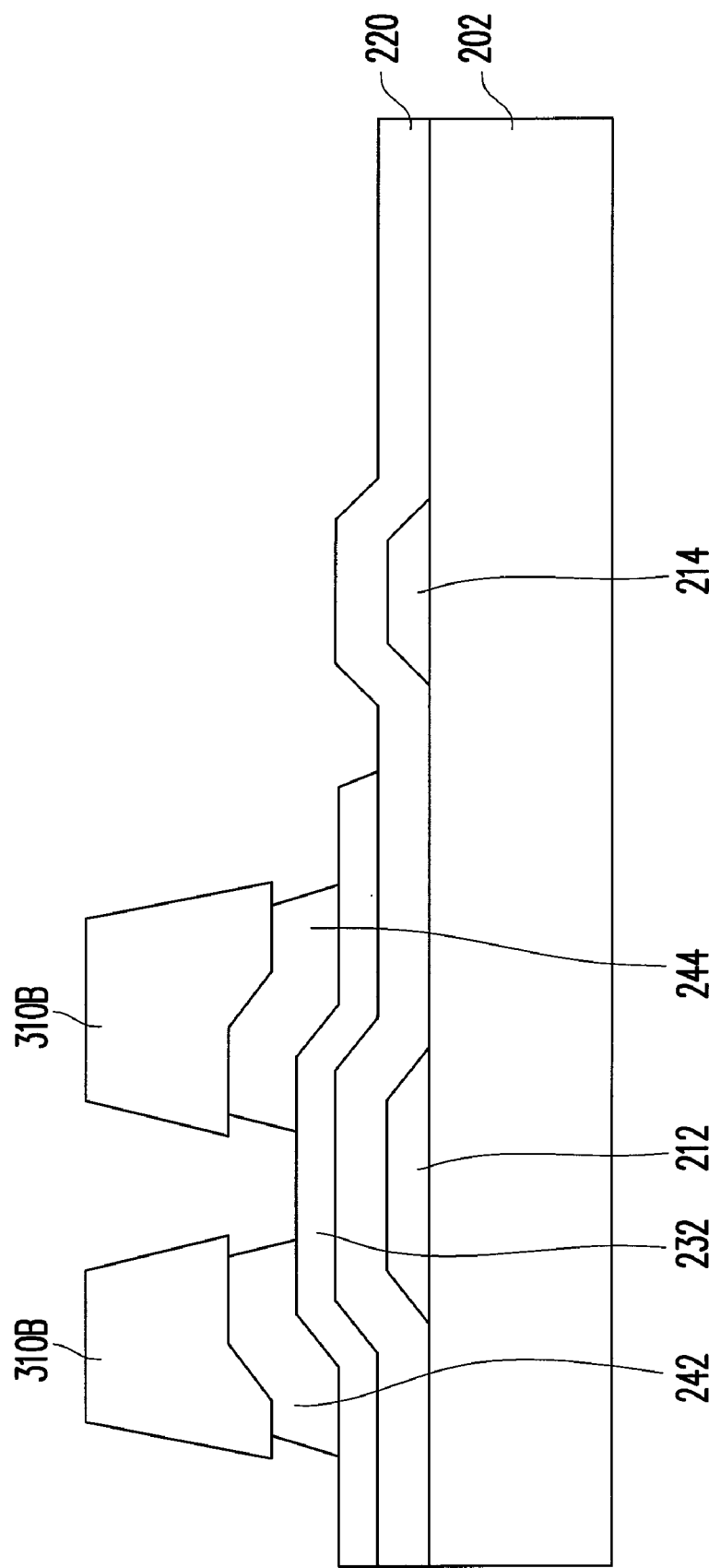
Figure 4D:
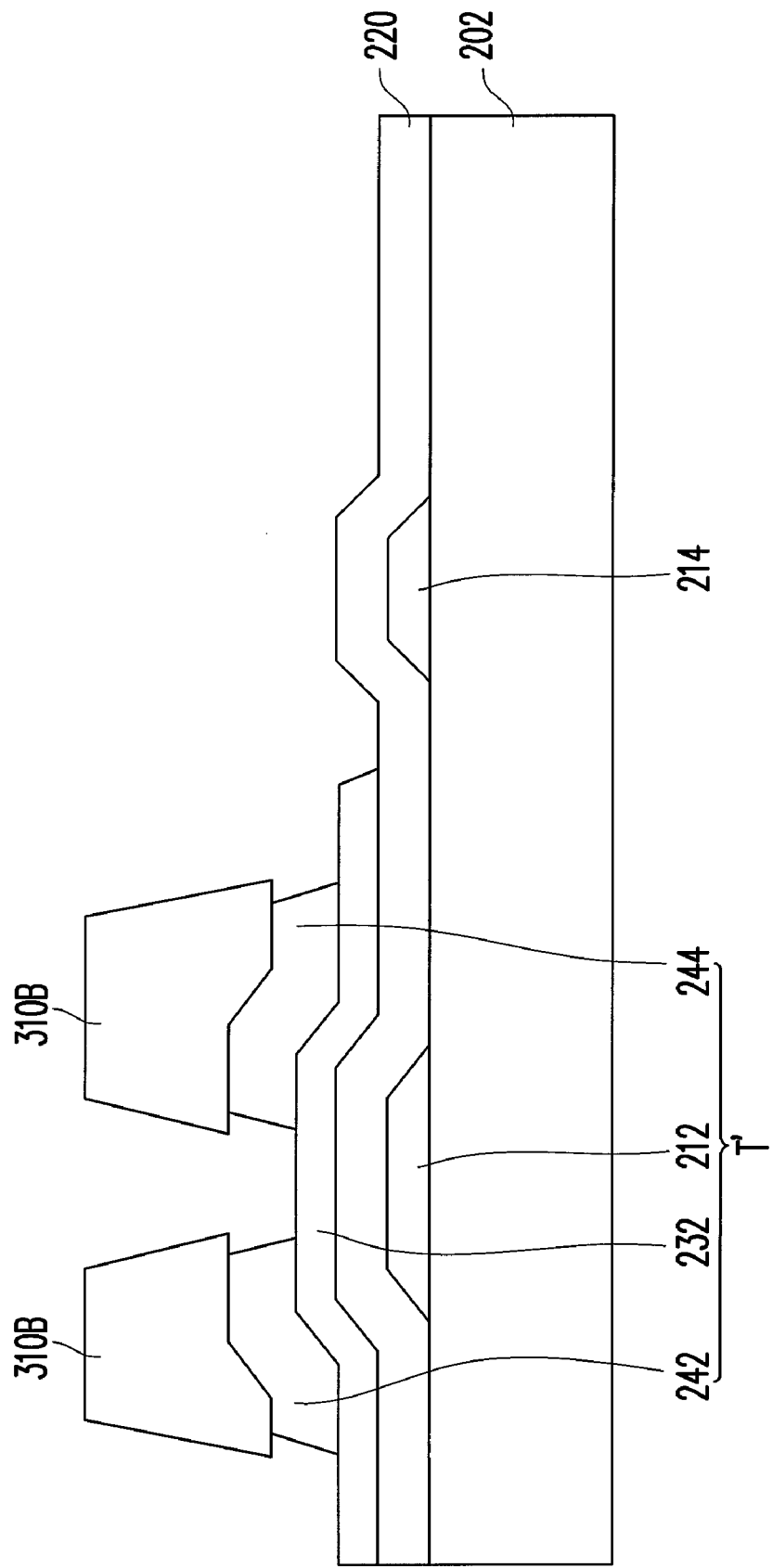

Referring to FIG. 3D, a second etching process is performed to the conductive layer 240 with the remaining second photoresist block 310B as a mask to form the source 242 and the drain 244 from the remaining conductive layer 240 (as shown in FIG. 3C) and the channel layer 232 from the remaining semiconductor layer 230, wherein the second etching process may be a wet etching process. Then referring to FIG. 3E, a third etching process is performed to the Ohmic contact layer 236 with the remaining second photoresist block 310B as a mask to remove the Ohmic contact layer 236 not covered by the second photoresist block 310B, wherein the third etching process may be a wet etching process.

FIGS. 4A~4D are diagrams illustrating another method for simultaneously forming the channel layer 232, the source 242, and the drain 244. The method illustrated in FIGS. 4A~4D is similar to that illustrated in FIGS. 3A~3E, and the difference between the two embodiments is that the fabrication of the Ohmic contact layer 236 is skipped in the present embodiment. Namely, the TFT T' does not have an Ohmic contact layer 236.

As described above, in the present invention, the channel layer, the source, and the drain are formed simultaneously, and the color filter layer is integrated into the TFT array substrate through an inkjet printing process. Thus, compared to the conventional technique, less PEPs are performed in the present invention. In addition, the pixel structure fabricating method provided by the present invention has at least following advantages:

1. According to the method for fabricating a pixel structure provided by the present invention, no photolithography process is performed for forming the color filter layer. Thus, the fabricating cost of high-precision masks used in the photolithography process can be skipped.
2. Since the process for fabricating a pixel structure is simplified, defects caused during PEPs (such as photoresist coating, soft baking, hard baking, exposing, developing, and photoresist removing etc) can be avoided.
3. Since the color filter layer is formed through an inkjet printing process, compared to the conventional technique wherein a PEP is performed for the same purpose, the material used for forming the color filter layer is effectively reduced and accordingly the fabricating cost of the pixel structure is also reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel structure fabricating method, comprising:
   forming a gate on a substrate;
   forming a gate insulation layer on the substrate to cover the gate;
   simultaneously forming a channel layer, a source, and a drain on the gate insulation layer above the gate, wherein the source and the drain are located on a portion of the channel layer, and the gate, the channel layer, the source, and the drain form a thin film transistor (TFT);
   forming a passivation layer on the TFT and the gate insulation layer;
   forming a black matrix on the passivation layer, wherein the black matrix has a contact opening located above the drain and has a color filter containing opening isolated to the contact opening, and the contact opening and the color filter containing opening expose a portion of the passivation layer;
   forming a color filter layer directly on the exposed passivation layer and the black matrix within the color filter containing opening through an inkjet printing process, wherein the color filter is contact with the exposed passivation layer and the black matrix;
   forming a dielectric layer on the black matrix and the color filter layer;
   patterning the dielectric layer and the passivation layer to expose the drain; and
   forming a pixel electrode on the color filter layer electrically connected to the drain through the contact opening of the black matrix directly.

2. The pixel structure fabricating method according to claim 1, wherein the step of simultaneously forming the channel layer, the source, and the drain comprises:
   forming a semiconductor layer on the gate insulation layer;
   forming a conductive layer on the semiconductor layer;
   forming a photoresist layer on the conductive layer above the gate, wherein the photoresist layer comprises a first photoresist block and at least a second photoresist block, and the thickness of the first photoresist block is smaller than that of the second photoresist block;
   performing a first etching process to the conductive layer with the photoresist layer as a mask;
   reducing the thickness of the photoresist layer until the first photoresist block is completely removed; and
   performing a second etching process to the conductive layer with the remaining second photoresist block as a mask to form the source and the drain from the remaining conductive layer and to form the channel layer from the remaining semiconductor layer.

3. The pixel structure fabricating method according to claim 2, wherein at least one of the first etching process and the second etching process comprises a wet etching process.

4. The pixel structure fabricating method according to claim 2, wherein the step of reducing the thickness of the photoresist layer comprises performing a dry etching process.

5. The pixel structure fabricating method according to claim 4, wherein the dry etching process comprises performing an ashing process.

6. The pixel structure fabricating method according to claim 2, wherein while removing the first photoresist block, the semiconductor layer exposed by the photoresist layer is removed.

7. The pixel structure fabricating method according to claim 1, wherein the step of simultaneously forming the channel layer, the source, and the drain comprises:
   forming a semiconductor layer on the gate insulation layer;
   forming an Ohmic contact layer on the semiconductor layer;
   forming a conductive layer on the Ohmic contact layer;
   forming a photoresist layer on the conductive layer above the gate, wherein the photoresist layer comprises a first photoresist block and at least a second photoresist block, and the thickness of the first photoresist block is smaller than that of the second photoresist block;
   performing a first etching process to the conductive layer with the photoresist layer as a mask;
   reducing the thickness of the :photoresist layer until the first photoresist block is completely removed, wherein while removing the first photoresist block, a portion of the semiconductor layer and the Ohmic contact layer exposed by the second photoresist block are removed;
   performing a second etching process to the conductive layer with the remaining second photoresist block as a mask to form the source and the drain from the remaining conductive layer and to form the channel layer from the remaining semiconductor layer; and
   performing a third etching process to the Ohmic contact layer with the remaining second photoresist block as a mask to remove the Ohmic contact layer exposed by the second photoresist block.

8. The pixel structure fabricating method according to claim 7, wherein at least one of the first etching process and the second etching process comprises a wet etching process.

9. The pixel structure fabricating method according to claim 7, wherein the step of reducing the thickness of the photoresist layer comprises a dry etching process.

10. The pixel structure fabricating method according to claim 9, wherein the dry etching process comprises an ashing process.

11. The pixel structure fabricating method according to claim 1, wherein the step of patterning the dielectric layer and the passivation layer comprises:
    forming a photoresist layer on the dielectric layer; and
    removing a portion of the dielectric layer and a portion of the passivation layer with the photoresist layer as a mask to respectively form a first opening and a second opening in the dielectric layer and the passivation layer, wherein the first opening and the second opening are corresponding to the contact opening.

12. The pixel structure fabricating method according to claim 1, wherein the step of forming the pixel electrode comprises:
    forming an electrode material layer on the patterned passivation layer, the black matrix, and the drain; and
    patterning the electrode material layer.

13. The pixel structure fabricating method according to claim 1, further comprising:
    forming a first capacitance electrode while forming the gate; and
    forming a patterned semiconductor and a second capacitance electrode while forming the channel layer, the source, and the drain, wherein the first capacitance electrode and the second capacitance electrode form a storage capacitor.

14. The pixel structure fabricating method according to claim 1, wherein the dielectric layer substantially covers two sidewalls of the black matrix adjacent to the contact opening.

15. The pixel structure fabricating method according to claim 1, wherein the dielectric layer does not cover two sidewalls of the black matrix adjacent to the contact opening.

16. The pixel structure fabricating method according to claim 1, further comprising forming a first capacitance electrode while forming the gate, wherein the first capacitance electrode and the pixel electrode form a storage capacitor.

17. The pixel structure fabricating method according to claim 1, further comprising forming a patterned semiconductor and a second capacitance electrode while forming the channel layer, the source, and the drain, wherein the second capacitance electrode and the pixel electrode form a storage capacitor.

18. A pixel structure fabricating method, comprising:
forming a gate on a substrate;
forming a gate insulation layer on the substrate to cover the gate;
simultaneously forming a channel layer, a source, and a drain on the gate insulation layer above the gate, wherein the source and the drain are located on a portion of the channel layer, and the gate, the channel layer, the source, and the drain form a thin film transistor (TFT);
forming a passivation layer on the TFT and the gate insulation layer;
forming a black matrix on the passivation layer, wherein the black matrix has a contact opening located above the drain and has a color filter containing opening isolated to the contact opening, and each of the contact opening and the color filter containing opening disposes between the black matrix and expose a portion of the passivation layer;
forming a color filter layer within the color filter containing opening through an inkjet printing process, wherein the color filter is directly formed on the exposed passivation layer and between the black matrix, so that the color filter is contact with the exposed passivation layer and the black matrix;
forming a dielectric layer on the black matrix and the color filter layer;
patterning the dielectric layer and the passivation layer to expose the drain; and
forming a pixel electrode on the color filter layer electrically connected to the drain through the contact opening of the black matrix.

* * * * *